United States Patent
Miura et al.

(10) Patent No.: US 9,324,782 B2
(45) Date of Patent: Apr. 26, 2016

(54) SEMICONDUCTOR DEVICE

(71) Applicants: Naruhisa Miura, Tokyo (JP); Shiro Hino, Tokyo (JP); Kenichi Ohtsuka, Tokyo (JP)

(72) Inventors: Naruhisa Miura, Tokyo (JP); Shiro Hino, Tokyo (JP); Kenichi Ohtsuka, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 14/344,195

(22) PCT Filed: Nov. 9, 2012

(86) PCT No.: PCT/JP2012/079063
§ 371 (c)(1),
(2) Date: Mar. 11, 2014

(87) PCT Pub. No.: WO2013/103051
PCT Pub. Date: Jul. 11, 2013

(65) Prior Publication Data
US 2015/0001549 A1  Jan. 1, 2015

(30) Foreign Application Priority Data
Jan. 6, 2012  (JP) ................. 2012-001293

(51) Int. Cl.
*H01L 29/06* (2006.01)
*H01L 29/12* (2006.01)
(Continued)

(52) U.S. Cl.
CPC ........ *H01L 29/0603* (2013.01); *H01L 29/0696* (2013.01); *H01L 29/12* (2013.01);
(Continued)

(58) Field of Classification Search
CPC ....................... H01L 29/06–29/0696
See application file for complete search history.

(56) References Cited

U.S. PATENT DOCUMENTS

| 4,833,513 A | 5/1989 | Sasaki |
| 5,408,118 A | 4/1995 | Yamamoto |

(Continued)

FOREIGN PATENT DOCUMENTS

| EP | 0 823 735 | 2/1998 |
| JP | 61 168263 | 7/1986 |

(Continued)

OTHER PUBLICATIONS

International Preliminary Report on Patentability and Written Opinion issued Jul. 17, 2014, in International Application No. PCT/JP2012/079063.

(Continued)

*Primary Examiner* — Jesse Y Miyoshi
*Assistant Examiner* — David Spalla
(74) *Attorney, Agent, or Firm* — Oblon, McClelland, Maier & Neustadt, L.L.P.

(57) ABSTRACT

A semiconductor layer, a well region, and a source region form a unit cell. The unit cell is defined into a certain shape in plan view at a main surface of the semiconductor layer, and a plurality of the unit cells is coupled in a chain manner to form a unit chain structure with a constriction. The certain shape of the unit cell is defined by an outer edge of a virtual region of the semiconductor layer defined so as to include the source region and the well region inside and by respective outer edges of the source region and the well region at a joint with a different unit cell. An active region is composed of a plurality of the unit chain structures. The unit chain structures are arranged so as to avoid generation of a gap between the unit cells of adjacent ones of the unit chain structures.

14 Claims, 26 Drawing Sheets

(51) Int. Cl.
  *H01L 29/66* (2006.01)
  *H01L 29/78* (2006.01)
  *H01L 29/10* (2006.01)
  *H01L 29/16* (2006.01)
  *H01L 29/20* (2006.01)

(52) U.S. Cl.
  CPC .... *H01L29/66045* (2013.01); *H01L 29/66068* (2013.01); *H01L 29/66712* (2013.01); *H01L 29/7811* (2013.01); *H01L 29/0615* (2013.01); *H01L 29/0638* (2013.01); *H01L 29/1095* (2013.01); *H01L 29/1602* (2013.01); *H01L 29/1608* (2013.01); *H01L 29/2003* (2013.01)

(56) References Cited

U.S. PATENT DOCUMENTS

| | | | | |
|---|---|---|---|---|
| 5,521,410 | A * | 5/1996 | Yamamoto | 257/342 |
| 5,703,389 | A | 12/1997 | Knoch et al. | |
| 6,040,609 | A * | 3/2000 | Frisina et al. | 257/391 |
| 8,487,374 | B2 * | 7/2013 | Ohta et al. | 257/334 |
| 2012/0205669 | A1 * | 8/2012 | Miura et al. | 257/77 |
| 2013/0020587 | A1 * | 1/2013 | Hino et al. | 257/77 |

FOREIGN PATENT DOCUMENTS

| | | |
|---|---|---|
| JP | 5 235362 | 9/1993 |
| JP | 6 275838 | 9/1994 |
| JP | 9 55506 | 2/1997 |
| JP | 11 214529 | 8/1999 |
| JP | 11 330469 | 11/1999 |
| JP | 2006 19608 | 1/2006 |

OTHER PUBLICATIONS

International Search Report Issued Jan. 22, 2013 in PCT/JP12/079063 Filed Nov. 9, 2012.

* cited by examiner

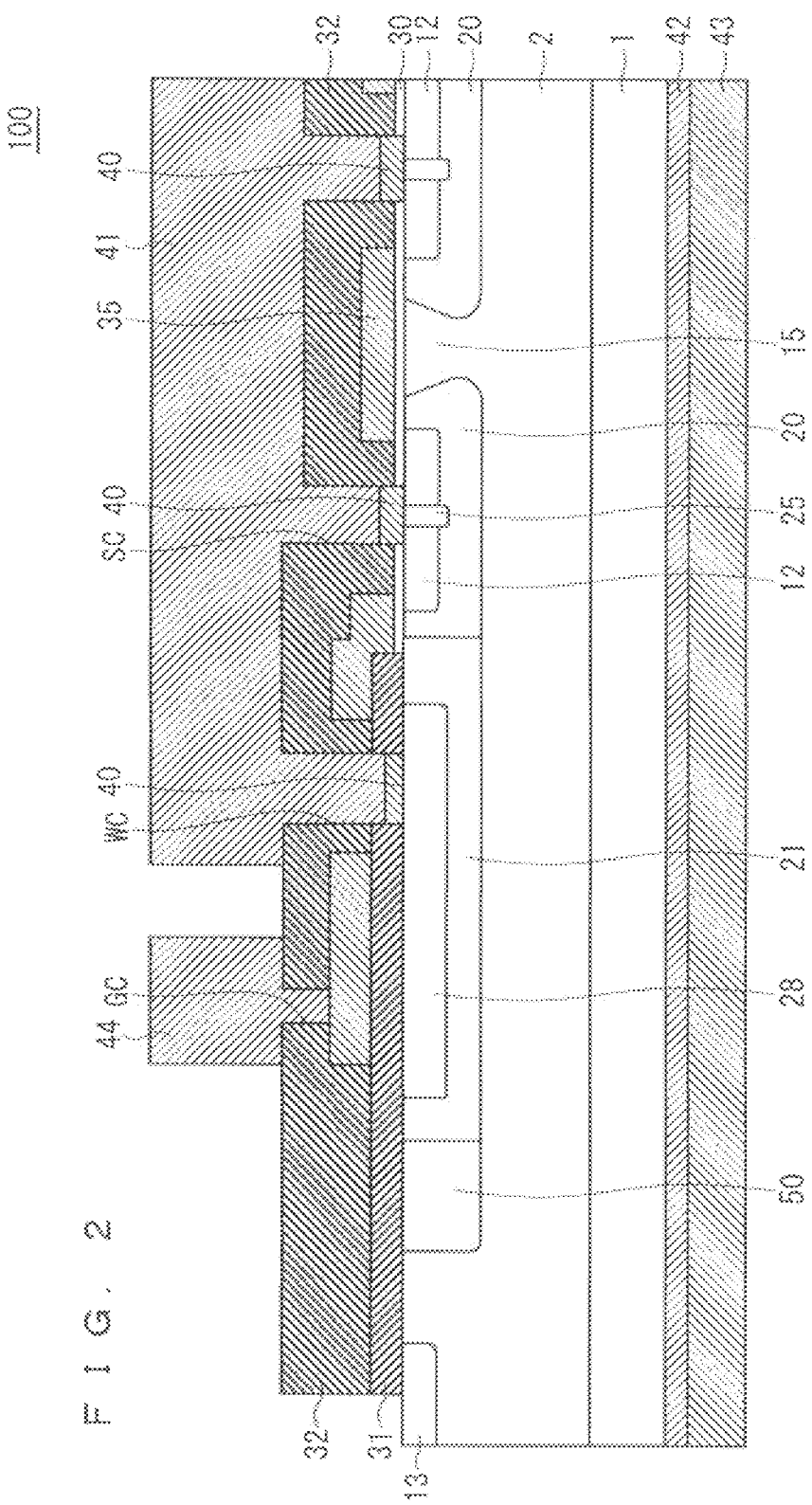

F I G. 8
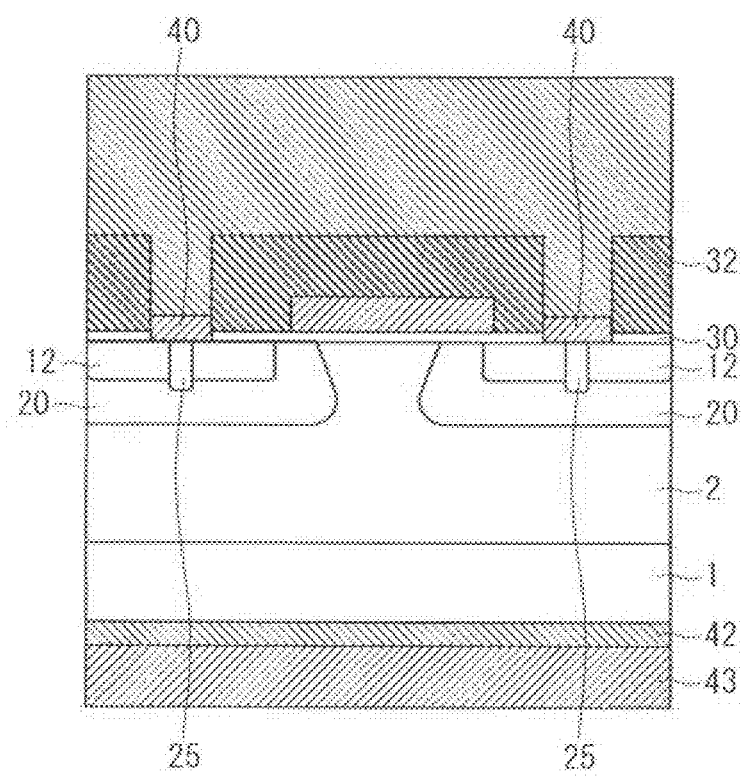

F I G. 1 3
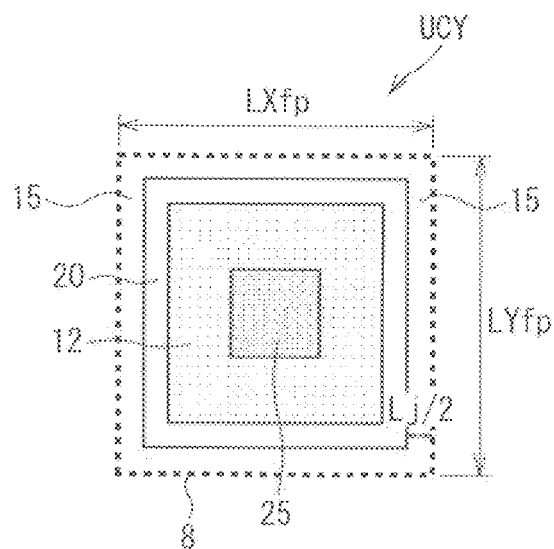
F I G. 1 4
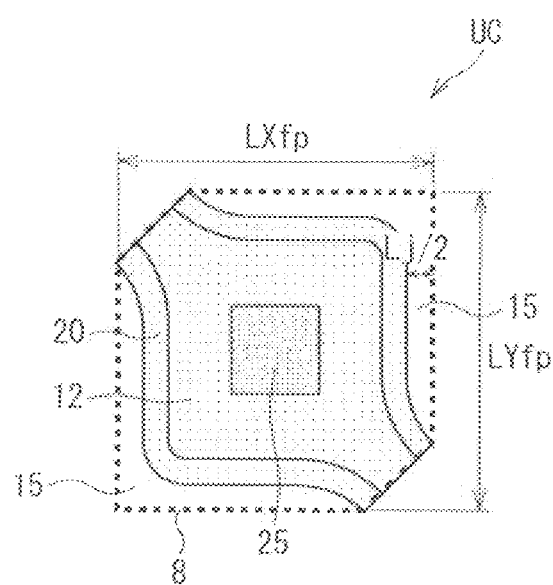

F I G. 15

| STRUCTURE | | | Lxfp=8.4μm Lj=1.0μm | Lxfp=9.4μm Lj=2.0μm | Lxfp=10.4μm Lj=3.0μm |
|---|---|---|---|---|---|
| STRIPE SHAPE | | | 0.24 | 0.21 | 0.19 |
| SQUARE CELL | | | 0.36 | 0.29 | 0.24 |
| PRESENT INVENTION | WIDTH Lss:1.0μm | | 0.38 | 0.32 | 0.28 |
| | | COMPARED TO STRIPE SHAPE | +58% | +50% | +45% |
| | | COMPARED TO SQUARE | +3.3% | +10% | +18% |
| PRESENT INVENTION | WIDTH Lss:0.5μm | | 0.39 | 0.33 | 0.29 |
| | | COMPARED TO STRIPE SHAPE | +66% | +57% | +51% |
| | | COMPARED TO SQUARE | +8.5% | +15% | +22% |

FIG. 16

| STRUCTURE | | Lxfp=8.4 μm Lj=1.0 μm | Lxfp=9.4 μm Lj=2.0 μm | Lxfp=10.4 μm Lj=3.0 μm |
|---|---|---|---|---|
| STRIPE SHAPE | | 12% | 21% | 29% |
| SQUARE CELL | | 22% | 38% | 40% |
| PRESENT INVENTION | WIDTH Lss:1.0 μm | 19% | 33% | 40% |
| PRESENT INVENTION | WIDTH Lss:0.5 μm | 20% | 34% | 44% |

F I G. 1 9
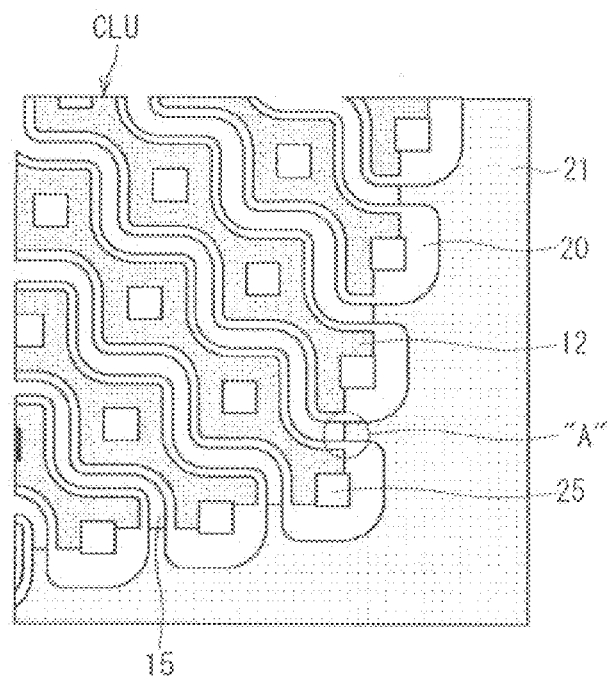
F I G. 2 0
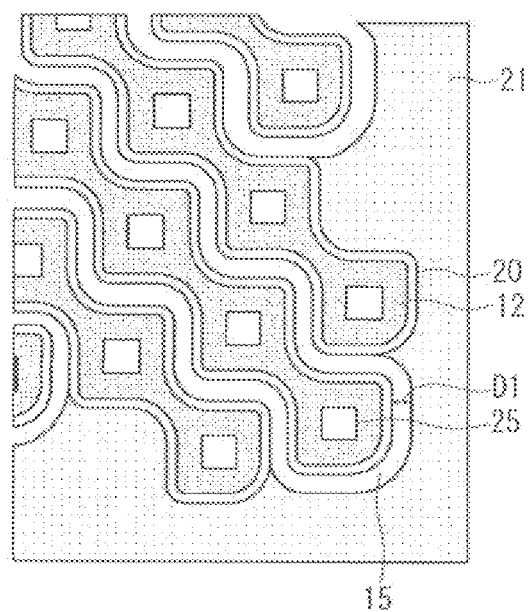

F I G. 3 3
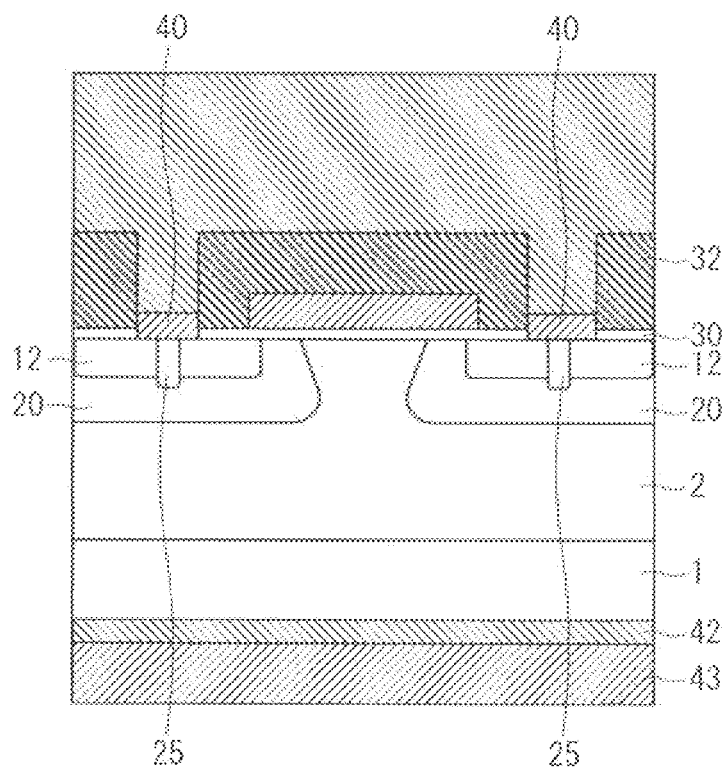

000# SEMICONDUCTOR DEVICE

TECHNICAL FIELD

The present invention relates to a semiconductor device and more specifically, to a semiconductor device using a wide band-gap semiconductor.

BACKGROUND ART

A semiconductor device and particularly, a field effect transistor having a junction structure of metal, oxide and semiconductor (MOS) using a wide band-gap semiconductor such as silicon carbide (MOSFET) is required to reduce power dissipation in terms of application to power electronics and energy saving of equipment on which such a semiconductor device is mounted. Such a semiconductor device is particularly required to reduce power dissipation (ON power dissipation) during a current-conducting state, specifically reduce ON resistance.

This may be achieved by reducing channel resistance. For reduction of channel resistance, channel mobility may be increased by increasing the quality of a junction of metal, insulator and wide band-gap semiconductor, by reducing a channel length, or by increasing a channel width density, for example.

According to the disclosure of Japanese Patent Application Laid-Open No. 9-55506, a cell that conventionally has a linear stripe shape is shaped into a stripe with circular or rounded portions formed at opposite ends of a linear part, specifically the cell has a dumb-bell shape. Such cells are arranged in an offset pattern, thereby achieving a 25 to 35 percent reduction of ON resistance.

Summary of Invention

Problems to be Solved by Invention

According to the structure of Japanese Patent Application Laid-Open No. 9-55506 where the cells of a dumb-bell shape are arranged in an offset pattern, a distance between base regions of adjacent cells is not uniform. Hence, if a high voltage is applied during turn-off operation of the semiconductor device, an electric field in a gate insulating film is increased in an area of a relatively long distance between base regions to induce a gate leakage current. This might impair the reliability of the semiconductor device as the semiconductor device might be damaged in some cases.

The present invention has been made to solve the aforementioned problem. It is an object of the present invention to provide a highly-reliable semiconductor device by reducing resistance during the semiconductor device is on by increasing a channel width density and at the same time, by preventing local occurrence of a high electric field during turn-off operation.

Means of Solving Problems

A semiconductor device of the present invention includes: a semiconductor substrate of a first conductivity type; a semiconductor layer of the first conductivity type provided on a first main surface of the semiconductor substrate; a well region of a second conductivity type selectively provided in a main surface of the semiconductor layer; and a source region of the first conductivity type selectively provided in a surface of the well region. The semiconductor layer, the well region, and the source region form a unit cell. The unit cell is defined into a certain shape in plan view at the main surface of the semiconductor layer. A plurality of the unit cells is coupled in a chain manner to form a unit chain structure with a constriction. The certain shape of the unit cell is defined by an outer edge of a virtual region of the semiconductor layer defined so as to include the source region and the well region inside and by respective outer edges of the source region and the well region at a joint with a different unit cell. An active region is composed of a plurality of the unit chain structures. The unit chain structures are arranged in an offset pattern so as to avoid generation of a gap between the unit cells of adjacent ones of the unit chain structures. A distance between the well regions defined by adjacent ones of the unit chain structures is uniform in the active region.

Advantageous Effects of Invention

In the semiconductor device of the present invention, ON resistance is reduced by increasing a channel width density, and a channel length and a JFET length are uniform throughout the active region. This achieves a uniform current distribution determined during ON operation while inhibiting local occurrence of a high electric field during turn-off operation, thereby increasing the reliability of the semiconductor device.

BRIEF DESCRIPTION OF DRAWINGS

FIG. 2 is a partial sectional view of the silicon carbide semiconductor device according to the present invention.

FIG. 8 is a partial sectional view taken at the unit chain structure of the silicon carbide semiconductor device according to the first embodiment of the present invention.

FIG. 13 is a plan view of a square unit cell.

FIG. 14 is a plan view of a unit cell according to the first embodiment of the present invention.

FIG. 15 shows a result about a channel width density calculated in the unit cell according to the first embodiment of the present invention.

FIG. 16 shows a result about an opening ratio of a JFET region calculated in the unit cell according to the first embodiment of the present invention.

FIG. 19 is a plan view showing the structure of a terminal portion of the unit chain structure of the silicon carbide semiconductor device according to the first embodiment of the present invention.

FIG. 20 is a plan view showing the structure of a terminal portion of the unit chain structure of the silicon carbide semiconductor device according to the first embodiment of the present invention.

FIG. 33 is a sectional view showing a step of manufacturing the silicon carbide semiconductor device according to the first embodiment of the present invention.

DESCRIPTION OF EMBODIMENT(S)

<Introduction>

The term "MOS" has formerly been used to designate a junction structure of metal, oxide and semiconductor, and has been considered to get its name from the initials of metal, oxide and semiconductor. Meanwhile, referring particularly to a field effect transistor having a MOS structure (hereinafter simply called a "MOS transistor"), a material for a gate insulating film or that for a gate electrode has been improved in response to a higher integration level and improvement of manufacturing processes in recent years, for example.

Referring for example to a MOS transistor, polycrystalline silicon has been used instead of metal as a material for a gate electrode in terms of mainly forming a source and a drain in a self-aligned manner. Further, a material of a high dielectric constant is used as a material for a gate insulating film in terms of improving electrical characteristics. Such a high-dielectric constant material is not necessarily limited to an oxide.

Hence, use of the term "MOS" is not limited to a stacked structure of metal, oxide and semiconductor, and the present specification does not assume this limitation as a precondition. Specifically, the term "MOS" mentioned herein is not only the abbreviation resulting from its origin but it also widely encompasses a stacked structure of conductor, insulator and semiconductor.

In the following description, regarding the conductivity type of impurities, n-type impurities are defined as those of a "first conductivity type" whereas p-type impurities are defined as those of a "second conductivity type." However, impurities may be defined in the opposite way.

<First Embodiment>
<Device Structure>

Figure 1:
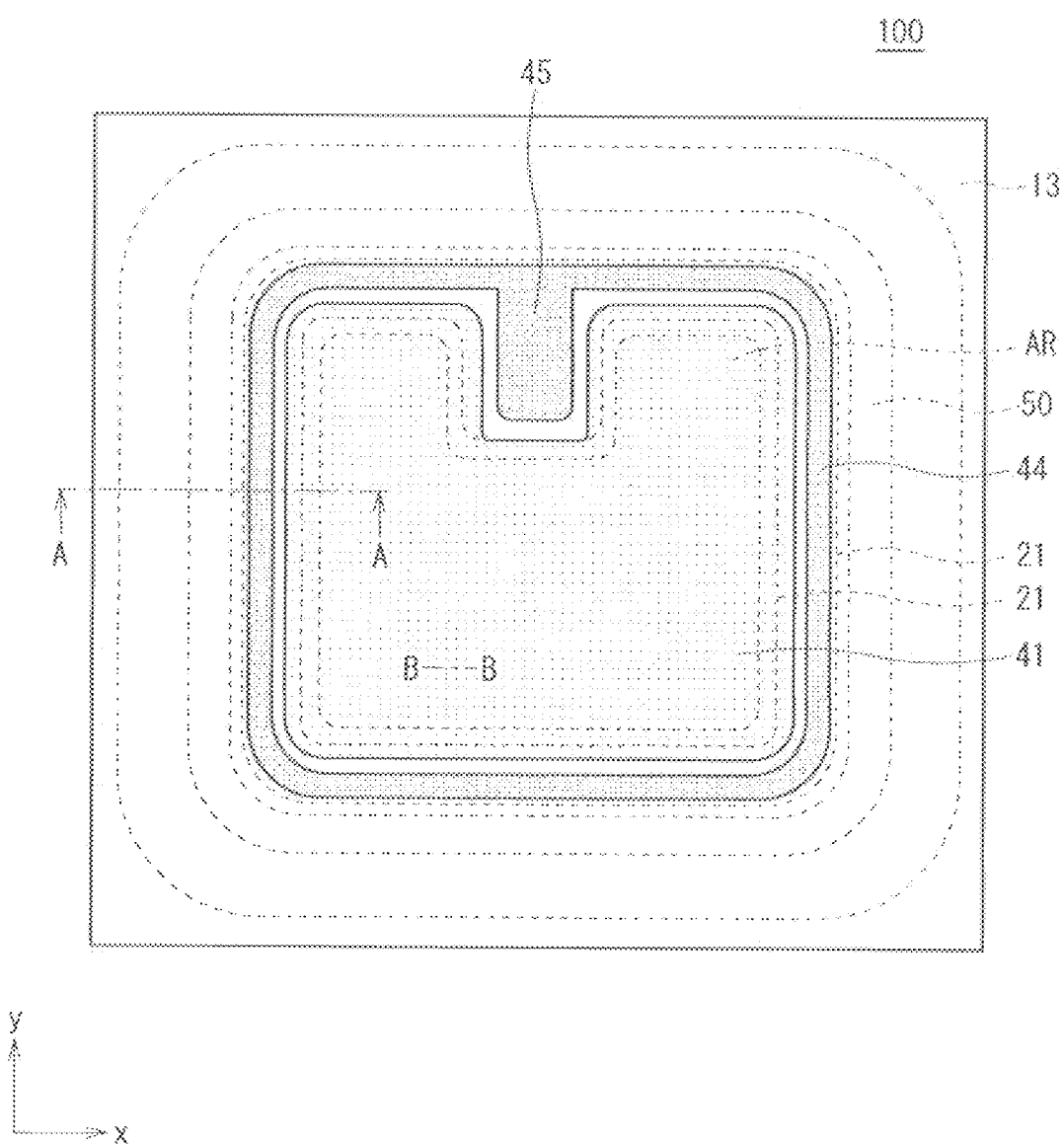
FIG. 1 is a top view of a silicon carbide semiconductor device according to the present invention.

FIG. 1 is a plan view schematically showing the structure of an upper surface of a semiconductor device of a first embodiment of the present invention, more specifically a field effect transistor (silicon carbide MOS transistor) 100 having a MOS structure formed on a silicon carbide (SiC) substrate.

As shown in FIG. 1, in the silicon carbide MOS transistor 100, a source pad 41 is provided in a central portion of a main surface of a chip 5 rectangular in outer shape, and a gate interconnect 44 is provided so as to surround the source pad 41 from outside.

The source pad 41 is a rectangle in plan view with one side recessed inwardly at its central portion. A gate pad 45 extending from the gate interconnect 44 surrounding the source pad 41 is provided so as to get into the inwardly recessed part of the source pad 41.

The gate pad 45 is a part to receive a gate voltage from an external control circuit (not shown in the drawings). The gate voltage applied to the gate pad 45 is supplied through the gate interconnect 44 to a gate electrode (not shown in the drawings) of a unit cell as a minimum unit structure of the MOS transistor.

The source pad 41 is arranged on an active region where a plurality of unit cells is arranged. Respective source electrodes (not shown in the drawings) of the unit cells are connected in parallel.

A terminal well region 21 is provided below the source pad 41 so as to define an edge portion of an active region AR. A terminal low-resistance region 28 is provided in a surface of the terminal well region 21 so as to extend along the terminal well region 21. A JTE (junction termination extension) region 50 is formed so as to surround the terminal well region 21. A field stop region 13 is provided so as to surround the JTE region 50 from a position away from the JTE region 50 and reaches a chip terminal 5, as described later.

In many cases, an electrode for a temperature sensor and that for a current sensor are generally formed in a product. The presence or absence of such electrodes is not involved deeply in the structure and the effect of the present invention, so that these electrodes will not be described and will not be illustrated in the drawings.

The position of the gate pad 45 and the number of the gate pads 45, the shape of the gate interconnect 44 and that of the source pad 41, and the number of the gate interconnects 44 and that of the source pads 41 can be devised in various ways depending on a MOS transistor. Like the aforementioned electrode for a current sensor, for example, these positions and the numbers are not involved deeply in the structure and the effect of the present invention, so that they will not be described and will not be illustrated in the drawings.

A structure in cross section taken along line A-A of FIG. 1 is described next by referring to the sectional view of FIG. 2. As shown in FIG. 2, the silicon carbide MOS transistor 100 includes a drift layer 2 of the first conductivity type formed on a first main surface of a semiconductor substrate 1 as a silicon carbide substrate containing impurities of the first conductivity type, an ohmic electrode 42 formed on a second main surface (opposite the first main surface) of the semiconductor substrate 1, and a drain electrode 43 formed on the ohmic electrode 42.

An upper layer part of the drift layer 2 includes a plurality of selectively formed well regions 20 of the second conductivity type, the terminal well region 21 of the second conductivity type provided to reach the same depth as the well region 20 while defining the edge portion of the active region AR, the JTE region 50 connected to an end surface of the terminal well region 21 and surrounding the terminal well region 21, and the field stop region 13 surrounding the JTE region 50 from a position away from the JTE region 50. The terminal well region 21 may be given the same impurity distribution as the well regions 20 by forming the terminal well region 21 and the well regions 20 simultaneously.

A source region 12 of the first conductivity type and a well contact region 25 of the second conductivity type are formed in a surface of each well region 20. The well contact region 25 extends from a central portion of the upper surface of the source region 12 and penetrates through the source region 12 to get into the well region 20.

The terminal low-resistance region 28 of the second conductivity type is provided in a central portion of the surface of the terminal well region 21. The terminal well region 21 exists on opposite sides of the terminal low-resistance region 28 as viewed from above.

A region between adjacent wells is called a JFET (junction FET) region 15. A resistance value of a current path extending from a channel region formed inside the well region 20 during ON condition toward the silicon carbide substrate 1 can be reduced by implanting n-type impurities of a relatively high concentration into the JFET region 15. This can reduce ON resistance of the entire vertical MOSFET.

A gate insulating film 30 is formed on a main surface of the drift layer 2. The gate insulating film 30 is formed so as to cover an area from above between an edge portion of the terminal well region 21 and an edge portion of the source region 12, to cover adjacent source regions 12, and to cover the well regions 20 and the JFET region 15 from above between these source regions 12. A field oxide film 31 is formed on the drift layer 2 in an area where the gate insulating film 30 is not formed.

A gate electrode 35 is formed via the gate insulating film 30 so as to extend between edge portions of adjacent source regions 12. An interlayer insulating film 32 is formed so as to cove the gate electrode 35.

The gate electrode 35 is further formed in an area where the gate insulating film 30 and the field oxide film 31 are connected. The gate electrode 35 is further formed on the field oxide film 31 on the terminal low-resistance region 28. These gate electrodes 35 are also covered with the interlayer insulating film 32.

A gate contact hole GC is formed so as to penetrate through the interlayer insulating film 32 to reach the gate electrode 35 above the terminal low-resistance region 28. The gate interconnect 44 is formed so as to fill in the gate contact hole GC.

A well contact hole WC is formed so as to penetrate through the interlayer insulating film 32 and the field oxide film 31 to reach an ohmic electrode 40 formed on the terminal low-resistance region 28. A source contact hole SC is formed so as to penetrate through the interlayer insulating film 32 to reach an ohmic electrode 40 formed on the well contact region 25 and the source region 12. The source pad 41 is formed so as to fill in the well contact hole WC and the source contact hole SC. According to the aforementioned structure, the source pad 41 functions as a source electrode connected to the source region 12 and as a member to electrically connect the source regions 12 and the terminal well region 21.

Figure 3:
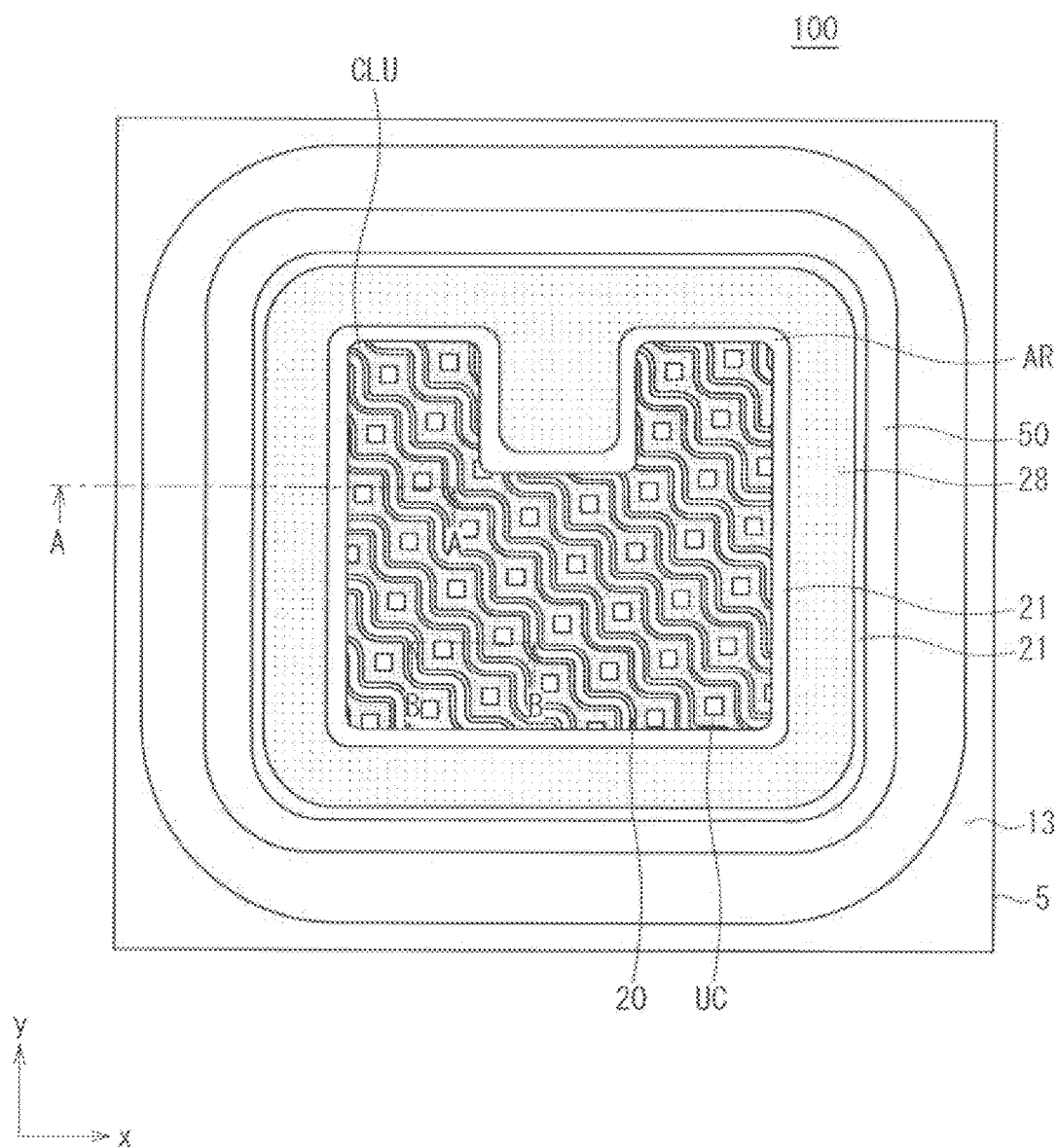
FIG. 3 is a plan view schematically showing each impurity region formed in a main surface of a semiconductor substrate of the silicon carbide semiconductor device according to the present invention.
Figure 4:
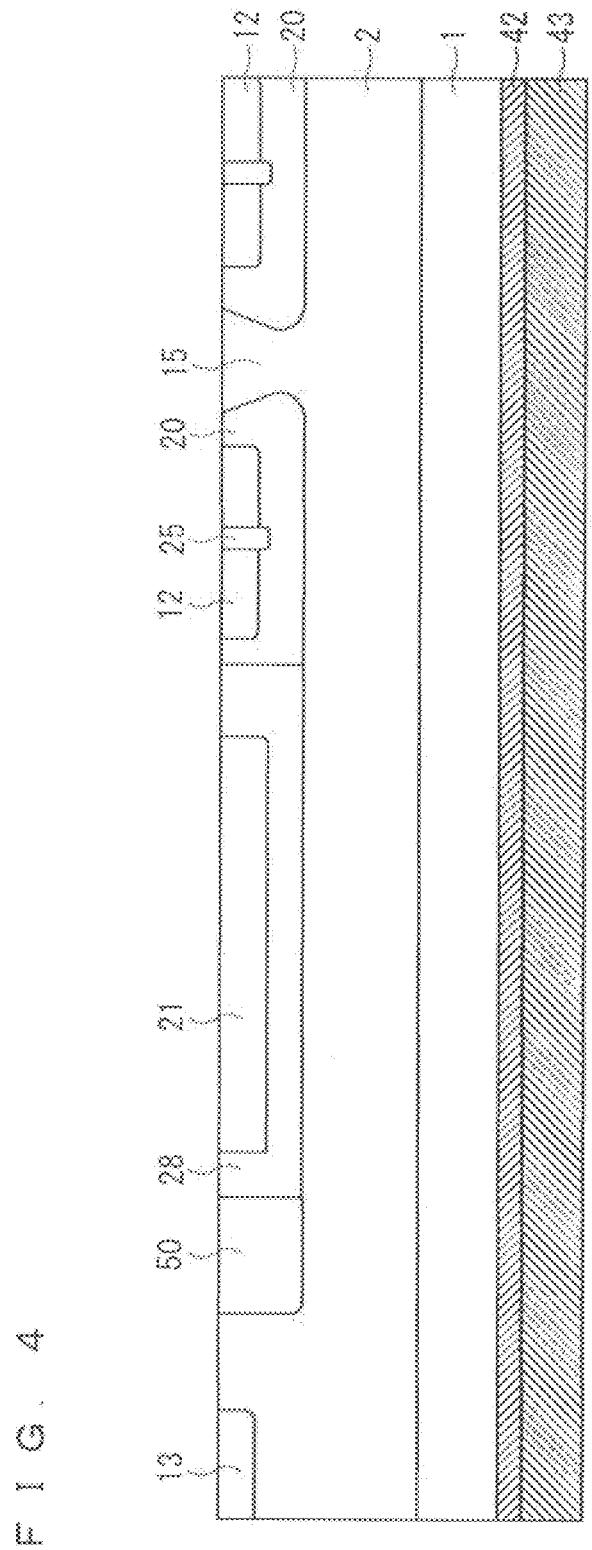
FIG. 4 is a partial sectional view of the silicon carbide semiconductor device according to the present invention.

FIG. 3 is a plan view schematically showing each impurity region formed in the main surface of the semiconductor substrate of the silicon carbide MOS transistor 100. FIG. 3 shows a structure below the source pad 41, the gate interconnect 44 and the gate pad 45 shown in FIG. 1. FIG. 3 is a plan view corresponding to the sectional view of FIG. 4.

The terminal well region 21 of the second conductivity type is provided so as to define the edge portion of the active region AR. The terminal low-resistance region 28 is provided in the surface of the terminal well region 21 so as to extend along the terminal well region 21. The JTE region 50 is formed so as to surround the terminal well region 21. The field stop region 13 is provided so as to surround the JTE region 50 from a position away from the JTE region 50 and reaches the chip terminal 5.

The active region AR includes a plurality of unit chain structures CLU arranged in parallel including recesses and projections formed alternately in plan view. In the silicon carbide MOS transistor 100 of the first embodiment, the active region AR is substantially rectangular and analogous to the shape of the source pad 41 in plan view. The unit chain structure CLU is formed at an angle of 45 degrees relative to one side (any of right, left, upper, and lower sides) of the active region AR.

Figure 5:
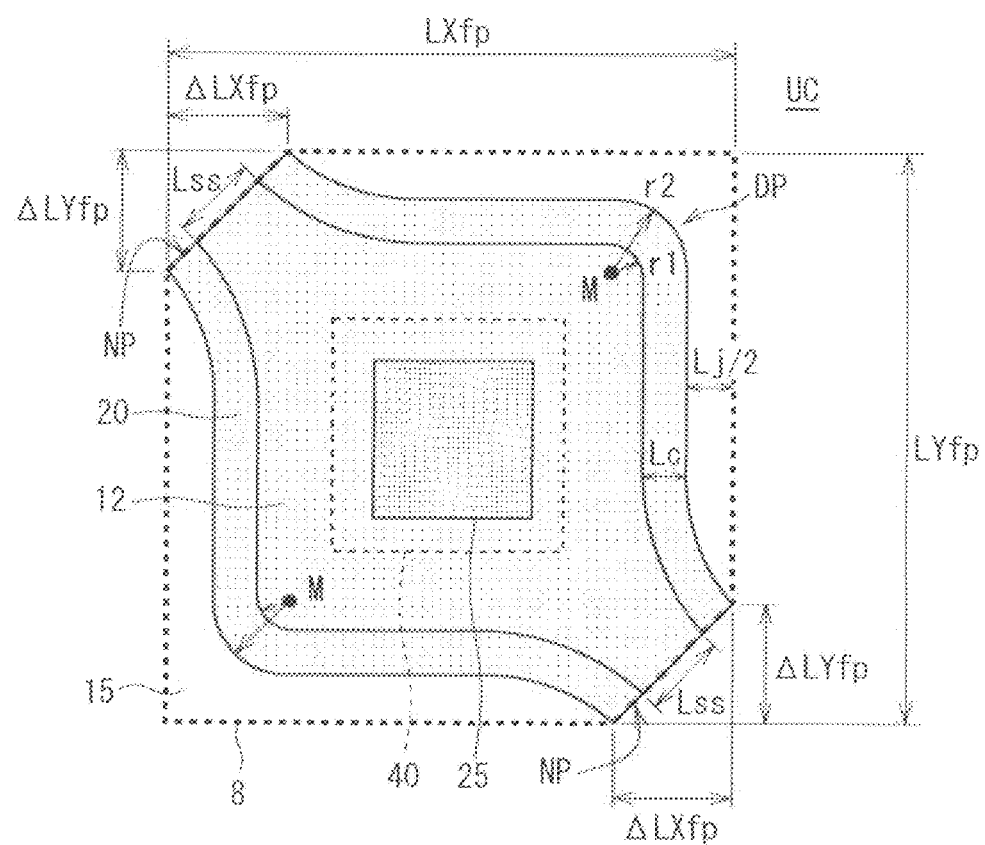
FIG. 5 schematically shows a planar shape of a unit cell forming a unit chain structure of the silicon carbide semiconductor device according to a first embodiment of the present invention.

FIG. 5 schematically shows a planar shape of a unit cell UC forming the unit chain structure CLU. As shown in FIG. 5, as indicated by an outer frame 8 of the unit cell UC, the unit cell UC has a hexagonal shape in plan view formed by cutting a right triangle with two sides having a length ΔLXfp in the horizontal (x) direction and a length ΔLYfp in the vertical (y) direction from each of opposite corners of a rectangle having a length LXfp in the horizontal (x) direction and a length LYfp in the vertical (y) direction. An area from which the corner is cut out is called a cut portion NP.

An outer edge of the source region 12 and that of the well region 20 are formed at a pair of opposite corners with no cutout and having an internal angle of 90 degrees so as to extend sides forming the internal angle. A distance between the outer edge of the well region 20 and the outer frame 8 of the unit cell UC (Lj/2) is uniform in a linear part. A region surrounded by the outer edge of the well region 20 and the outer frame 8 of the unit cell becomes the JFET region 15 of the silicon carbide MOS transistor 100 to be formed later.

The outer frame 8 of the unit cell UC is defined by the outer edge of a virtual region of the drift layer 2 defined so as to include the source region 12 and the well region 20 inside and by the respective outer edges of the source region 12 and the well region 20 at the cut portions NP. These outer edges are virtual edges, and the outer frame 8 is a virtual frame accordingly.

The respective outer edges of the source region 12 and the well region 20 extend linearly in an area extending along the sides of the outer frame 8. In each of areas facing a pair of opposite corners (residual corners) of an internal angle of 90 degrees, the source region 12 and the well region 20 form arcuate projections of a central angle of 90 degrees having the same center of curvature M (first center of curvature) and different radii of curvature r1 and r2 respectively (r2>r1).

The outer edge of the source region 12 in each cut portion NP is determined such that the width of the source region 12 is reduced rapidly in an arcuate pattern so as to fall within an edge of the cut portion NP. The width of the source region 12 at the edge of the cut portion NP is expressed as Lss. The width of the well region 20 is uniform throughout the unit cell UC.

The shape of the outer edge of the source region 12 determined by the aforementioned structure is as follows. The source region 12 starting from the edge of one cut portion NP extends in an arcuate pattern toward the two residual corners of the outer frame 8 of the unit cell UC. Then, the source region 12 extends parallel to the outer frame 8 and forms arcuate projections DP of a central angle of 90 degrees and having the radius of curvature r1 in areas facing the residual corners. After passing through the projections DP, the source region 12 extends parallel to the outer frame 8 again and then the width of the source region 12 is reduced rapidly in an arcuate pattern so as to fall within the edge of the other cut portion NP. The outer edge of the well region 20 extends along the outer edge of the source region 12 and is spaced by a distance Lc from the outer edge of the source region 12 (specifically, Lc=r2−r1). The distance Lc is maintained in linear parts and the projections.

The unit cell UC has the well contact region 25 in a central portion of the source region 12. The ohmic electrode 40 contacting the source region 12 is formed on the well contact region 25.

While the well contact region 25 and the ohmic electrode 40 are illustrated as rectangles in FIG. 5, they may alternatively have a polygonal or circular shape. Such a shape does not have influence on the effect of the device of the present invention described later.

While FIG. 5 shows that LXfp and LYfp are equal and ΔLXfp and ΔLYfp are equal, these lengths are not always required to be equal to each other.

The unit cells UC of the aforementioned shape in plan view are coupled at edges of the cut portions NP. As a result, the unit cells UC are coupled to form a chain structure with constrictions, thereby forming the unit chain structure CLU of FIG. 6.

Figure 6:
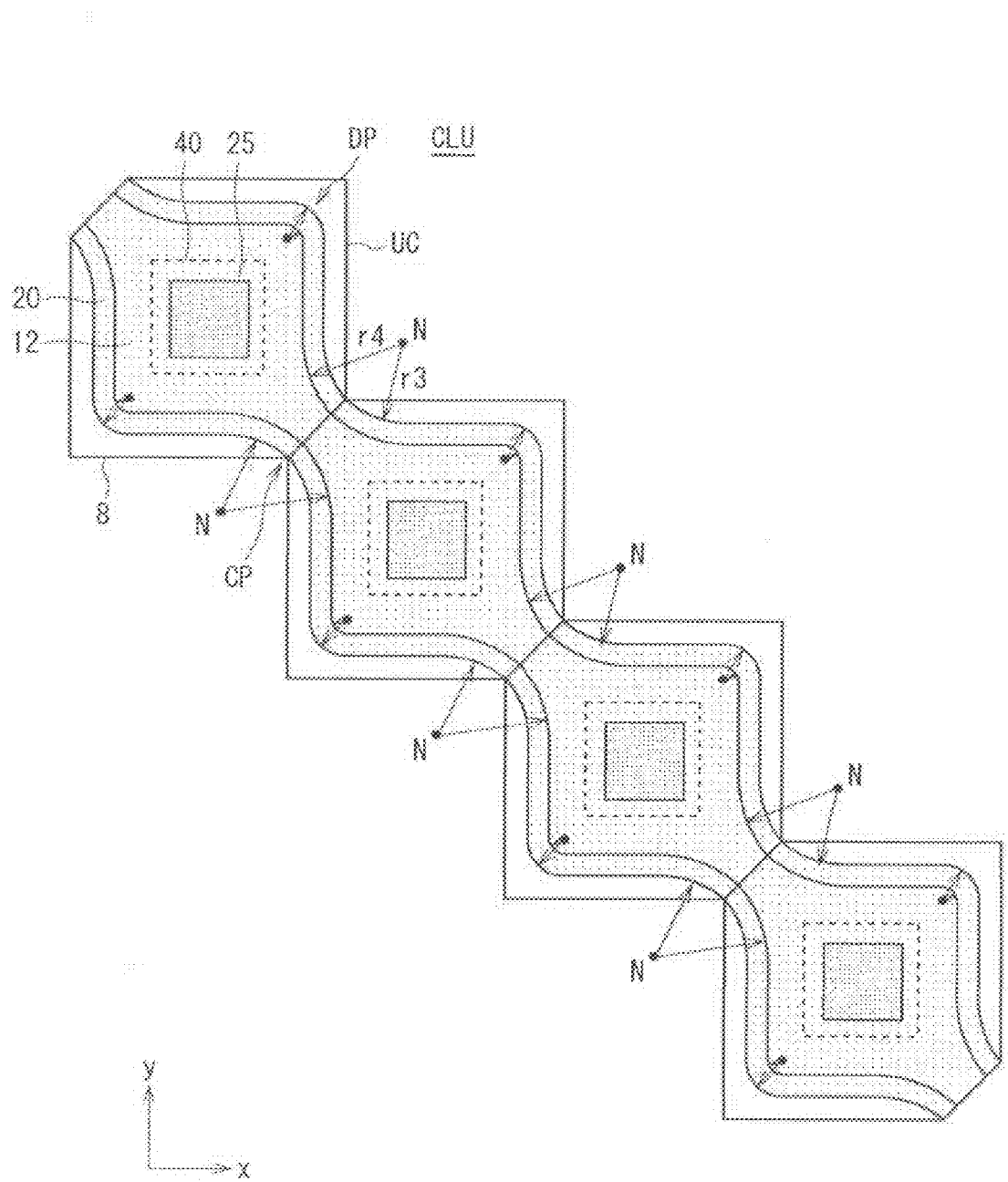
FIG. 6 schematically shows a planar shape of the unit chain structure of the silicon carbide semiconductor device according to the first embodiment of the present invention.

The unit chain structure CLU of FIG. 6 is composed of four coupled unit cells UC. However, this is not the only example of the number of the unit cells UC coupled in each unit chain structure CLU but this number may be devised in various ways as shown in the active region AR of FIG. 3.

At a joint between the unit cells UC, the respective outer edges of the source region 12 and the well region 20 are coupled smoothly and after being coupled, they form arcuate recesses CP of a central angle of 90 degrees having the same center of curvature N outside the unit cells UC.

At the joint between the unit cells UC, the respective outer edges of the source region 12 and the well region 20 have different radii of curvature r4 and r3 respectively (r4>r3) with the same center of curvature N (second center of curvature). Thus, the distance Lc (Lc=r4−r3) between the respective outer edges of the source region 12 and the well region 20 is also uniform at the joint between the unit cells UC and its vicinity.

Specifically, in the unit chain structure CLU, the distance Lc between the respective outer edges of the source region 12 and the well region 20 is uniform in linear parts and in the projections, and is also uniform at the joint between the unit cells UC and its vicinity. The uniform distance Lc between the respective outer edges of the source region 12 and the well region 20 in the surface area of the substrate means that a channel length is uniform throughout the unit chain structure CLU. The active region AR of the silicon carbide MOS transistor 100 is composed of the unit chain structures CLU that are arranged so as to avoid generation of a gap between the unit cells UC of adjacent unit chain structures CLU. Accordingly, it can be said that the channel length is uniform throughout the active region AR. This suppresses imbalance of a current distribution in the active region AR determined during ON operation, so that the reliability of the semiconductor device can be increased.

Figure 7:
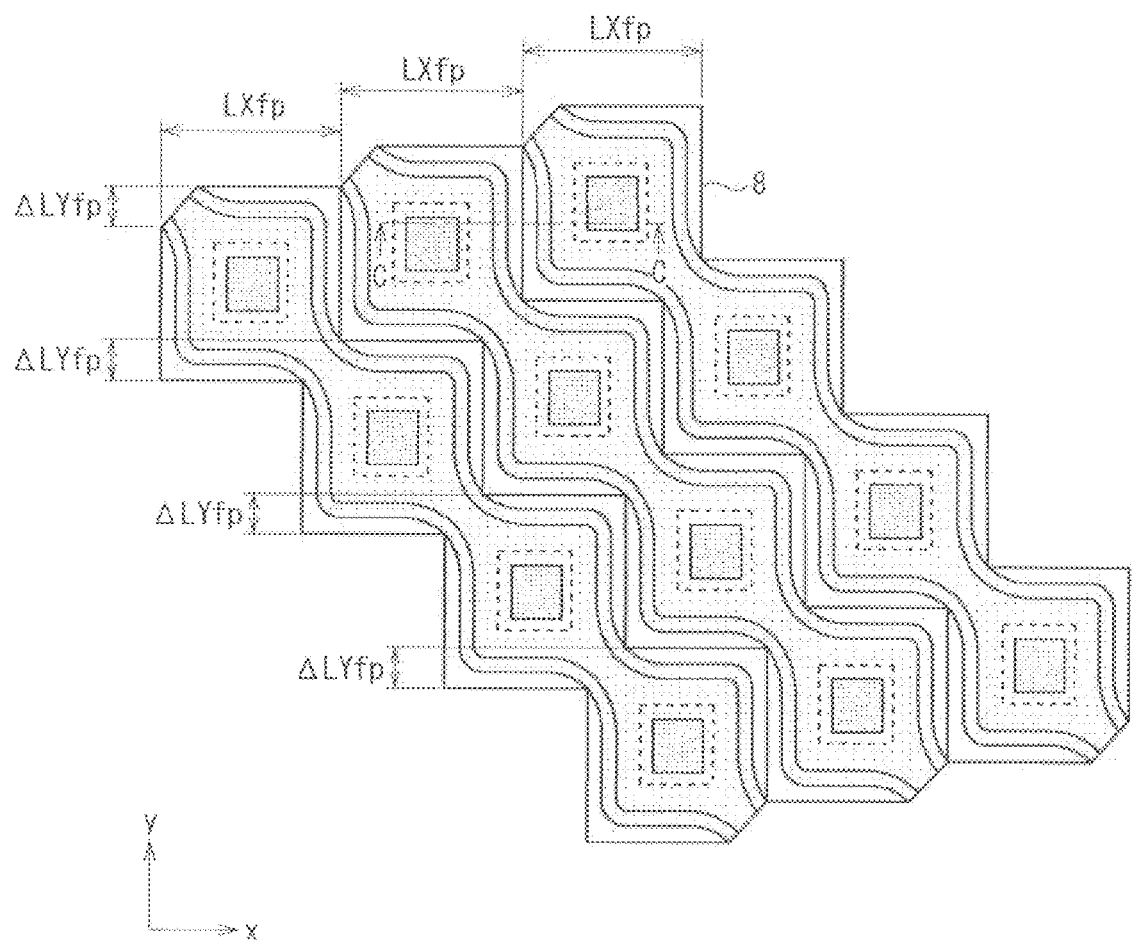
FIG. 7 schematically shows an example of arrangement of the unit chain structures of the silicon carbide semiconductor device according to the first embodiment of the present invention.

As shown in FIG. 7, the unit chain structures CLU are arranged in an offset pattern in the active region AR. Specifically, regarding adjacent unit chain structures CLU, the projections DP of the source region 12 and the well region 20 of one of the unit chain structures CLU are placed in a position corresponding to the position of the recesses CP of the source region 12 and the well region 20 of the other unit chain structure CLU.

FIG. 8 shows a structure in cross section of the silicon carbide MOS transistor 100 taken along line C-C of FIG. 7. As shown in FIG. 8, the ohmic electrode 40 is connected to the source region 12 and the well contact region 25 in each unit cell.

Figure 9:
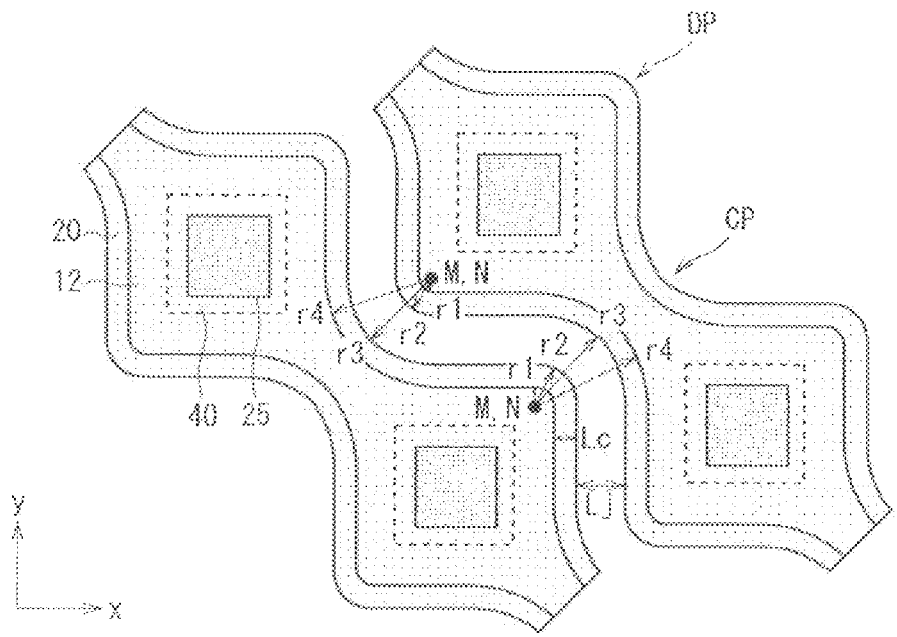
FIG. 9 schematically shows a planar shape of the unit chain structure of the silicon carbide semiconductor device according to the first embodiment of the present invention.

FIG. 9 explains the amount of offset between adjacent unit chain structures CLU. As shown in FIG. 9, the amount of the offset is determined such that the center of curvature M at the projection DP of one unit chain structure CLU agrees with the center of curvature N at the recess CP of the adjacent unit chain structure CLU.

More specifically, by referring to the example of FIG. 7, the unit chain structures CLU are shifted by LXfp in the horizontal (x) direction and by ΔLYfp in the vertical (y) direction. As a result of this arrangement, a distance between the respective outer edges of the well regions 20 in adjacent unit chain structures CLU becomes uniform (Lj) throughout the region. In other words, the aforementioned arrangement in an offset pattern satisfies the relationships of r2=r1+Lc, r3=r1+Lc+Lj and r4=r1+2 Lc+Lj, while making the radii of curvature r1, r2, r3 and r4 have the same center of curvature at the projection DP and the recess CP.

This maintains what is called a JFET length at Lj uniformly in the silicon carbide MOS transistor 100, so that resistance in a JFET region generated during ON operation becomes uniform throughout the active region AR. This suppresses imbalance of a current distribution in the active region AR determined during ON operation, so that reliability can be increased while a current-conducting state continues, for example.

The uniform JFET length (Lj) throughout the active region AR prevents local occurrence of a high electric field in the active region AR during OFF operation, so that reliability can be increased during application of a high drain bias, for example.

As described above, the active region AR is composed of the unit chain structures CLU that are arranged so as to avoid generation of a gap between the unit cells UC of adjacent unit chain structures CLU. This makes the channel length (Lc) and the JFET length (Lj) of the silicon carbide MOS transistor 100 uniform throughout the active region AR. This prevents degradation of or damage on the semiconductor device to be caused if concentration of an ON current occurs locally or concentration of an electric field in a gate insulating film occurs locally during ON operation for example due to imbalance of the channel length or the JFET length. As a result, reliability be increased significantly.

As shown in FIG. 9, the radius of curvature r1 of the source region 12 at the projection DP of the unit cell UC is the shortest among those at the aforementioned projections DP and the aforementioned recesses CP of the unit cell UC (or unit chain structure CLU) of the silicon carbide MOS transistor 100. The radius of curvature r1 can be determined based on pattern accuracy determined during manufacture of the semiconductor device and more specifically, based on pattern accuracy of a photoresist formed by photolithography technique. The reason therefor is given as follows.

Figure 10:
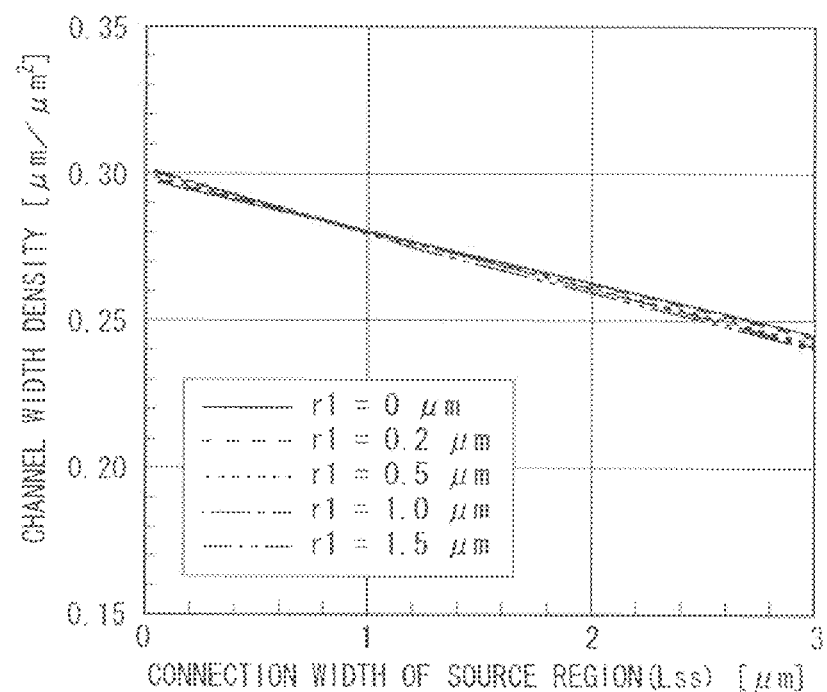
FIG. 10 shows a result of calculation about dependence of a connection width of a source region in a unit cell on a channel width density according to the first embodiment of the present invention.

FIG. 10 shows a result of calculation about a value of a channel width density in the unit cell UC with the varying radius of curvature r1, specifically a value calculated by dividing the length of the outer edge of the source region 12 by the area of the unit cell UC.

This calculation is made on the condition that LXfp and LYfp are 10.4 μm, ΔLYfp and ΔLXfp are equal, Lc is 0.5 μm, and Lj is 3 μm. The width Lss (connection width) of the source region 12 at the edge of the cut portion NP shown in FIG. 5 is determined as Lss=√2×ΔLYfp−2Lc.

In FIG. 10, the horizontal axis represents the connection width (Lss) of the source region 12 changed by the amount of offset (ΔLYfp) in the vertical (y) direction, and the vertical axis represents the channel width density (μm/μm$^2$). FIG. 10 shows dependency of the connection width determined with the radius of curvature r1 of 0 μm (the source region 12 is bent at a right angle with no curvature), 0.2 μm, 0.5 μm, 1.0 μm, and 1.5 μm.

As shown in FIG. 10, the dependency of the connection width (Lss) of the source region 12 on the channel width density is substantially independent from the radius of curvature r1. Accordingly, the radius of curvature r1 may be determined to be about 0.5 μm in terms of limitations of photolithography technique, or may be 1 μm or more so as to make an arcuate part relatively longer than a linear part.

<Effects>
<First Effect>

Figure 11:
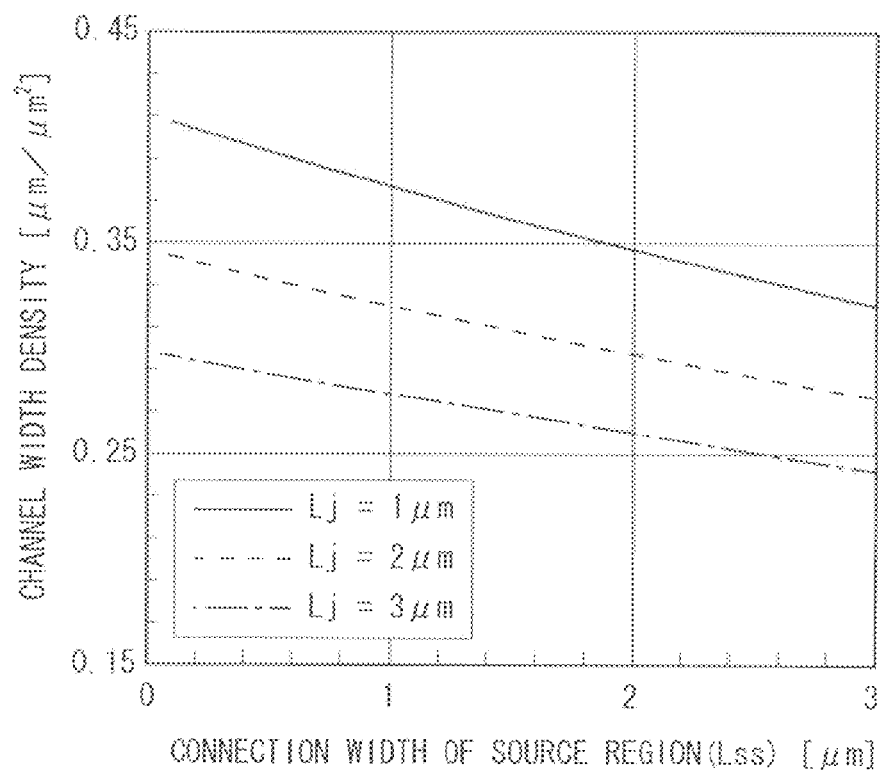
FIG. 11 shows a result of calculation about dependence of the connection width of the source region in the unit cell on the channel width density according to the first embodiment of the present invention.

FIG. 11 explains effect achieved by the silicon carbide MOS transistor 100 of the first embodiment of the present invention.

In FIG. 11, LXfp and LYfp are equal, ΔLYfp and ΔLXfp are equal, and Lc is 0.5 μm. Further, the horizontal axis represents the connection width (Lss) of the source region 12, and the vertical axis represents the channel width density (μm/μm$^2$). FIG. 11 shows dependency of the channel width density on the JFET length (Lj) determined with the JFET length Lj of 1.0 μm, 2 and 3 μm.

As shown in FIG. 11, regarding the dependency of the channel width density on the JFET length (Lj), reducing the connection width (Lss) of the source region 12 increases the channel width density. Accordingly, it can be said that the unit cell UC is preferably formed with a smaller connection width (Lss) of the source region 12. Meanwhile, it is desirable that the source region 12 be patterned by photoresist patterning using photolithography technique as described later. Hence, the connection width (Lss) of the source region 12 should be determined in terms of limitations of photolithography technique. If an exposure unit emitting an ultraviolet ray such as a g ray or an i ray is used, the connection width (Lss) may be about 0.5 μm in terms of process limitation.

The following shows a result obtained by calculating channel width densities (in units of μm/μm$^2$) in various unit cells of various shapes for comparison.

Figure 12:
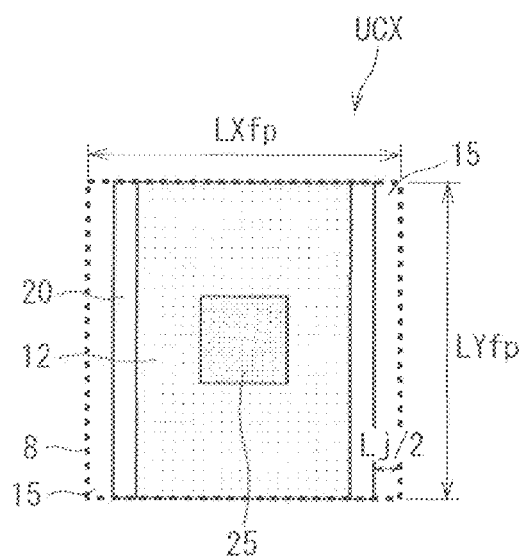
FIG. 12 is a plan view of a stripe unit cell.

FIG. 12 shows a unit cell UCX of a stripe structure with no recess or projection. FIG. 13 shows a square unit cell UCY. FIG. 14 shows the unit cell UC of the present invention.

The shape of the unit cell UCX of FIG. 12 is such that the well region 20 extends along opposite sides of the stripe source region 12.

The shape of the unit cell UCY of FIG. 13 is such that the well region 20 extends so as to surround the square source region 12. The unit cells UCY are aligned most densely if being arranged in a zigzag or grid pattern. The definitions of LXfp, LYfp, and JFET length Lj are common to all the unit cells.

The table of FIG. 15 shows a result about a channel width density calculated in each unit cell on the condition that LXfp and LYfp are equal, ΔLYfp and ΔLXfp are equal (applied only in the case of the unit cell UC), and Lc is 0.5 μm.

FIG. 15 shows a result about a channel width density calculated in each of the unit cell UCX (stripe shape), the unit cell UCY (square shape), and the unit cell UC of the present invention on the condition that LXfp is 8.4 μm and the JFET length (Lj) is 1 μm, that LXfp is 9.4 μm and the JFET length (Lj) is 2 μm, and that LXfp is 10.4 μm and the JFET length (Lj) is 3 μm. The channel width density of the unit cell UC is calculated on the condition that the connection width Lss of the source region 12 is 1 μm and 0.5 μm.

As shown in FIG. 15, the unit cell UC of the present invention increases the channel width density by approximately 50% under each condition compared to the unit cell UCX (stripe shape). The unit cell UC of the present invention increases the channel width density in a range of from 3% to 22% under each condition compared to the unit cell UCY (square shape). This shows that using the unit cell UC of the present invention increases the channel width density.

Increasing the channel width density can achieve a silicon carbide MOS transistor with low channel resistance and low power dissipation. The silicon carbide MOS transistor 100 of the first embodiment of the present invention achieves such an effect.

<Second Effect>

FIG. 16 explains a different effect achieved by the silicon carbide MOS transistor 100 of the first embodiment of the present invention.

FIG. 16 shows a result about an opening ratio of the JFET region 15 calculated in each of the unit cell UCX (stripe shape), the unit cell UCY (square shape), and the unit cell UC of the present invention.

The opening ratio of the JFET region 15 is defined by the area ratio of the JFET region 15 to the region surrounded by the outer frame 8 in each of the unit cell of FIGS. 12 to 14.

A lower opening ratio of the JFET region 15 reduces the gate-to-drain capacitance of a silicon carbide MOS transistor to reduce a reverse transfer capacitance. Thus, switching power dissipation can be reduced and this works advantageously for high-speed switching operation.

FIG. 16 shows a result about the opening ratio of the JFET region 15 calculated in each of the unit cell UCX (stripe shape), the unit cell UCY (square shape), and the unit cell UC of the present invention on the condition that LXfp is 8.4 μm and the JFET length (Lj) is 1 μm, that LXfp is 9.4 μm and the JFET length (Lj) is 2 μm, and that LXfp is 10.4 μm and the JFET length (Lj) is 3 μm. The opening ratio of the JFET region 15 of the unit cell UC is calculated on the condition that the connection width Lss of the source region 12 is 1 μm and 0.5 μm.

As shown in FIG. 16, the unit cell UC of the present invention provides the opening ratio ranging from 19% to 43% with the connection width Lss of the source region 12 of 1 μm, and the opening ratio ranging from 20% to 44% with the connection width Lss of the source region 12 of 0.5 μm. Accordingly, the unit cell UC of the present invention is found to reduce the opening ratio by about 2% to 5% compared to the unit cell UCY (square shape), while it does not reduce the opening ratio as much as the unit cell UCX (stripe shape) does.

As described above, the silicon carbide MOS transistor 100 of the first embodiment of the present invention further achieves the effect of reducing a reverse transfer capacitance, thereby reducing switching power dissipation.

<Additional Structures and Effects Thereof>

The unit chain structures CLU shown for example in FIG. 7 are arranged such that the well regions 20 of adjacent unit chain structures CLU in the silicon carbide semiconductor substrate (drift layer 2) are not connected. The shape of a terminal portion of the unit chain structure CLU in plan view can be devised in various ways.

FIGS. 17 to 22 show various shapes in plane view of the terminal portion of the unit chain structure CLU near a surface of the drift layer 2.

Figure 17:
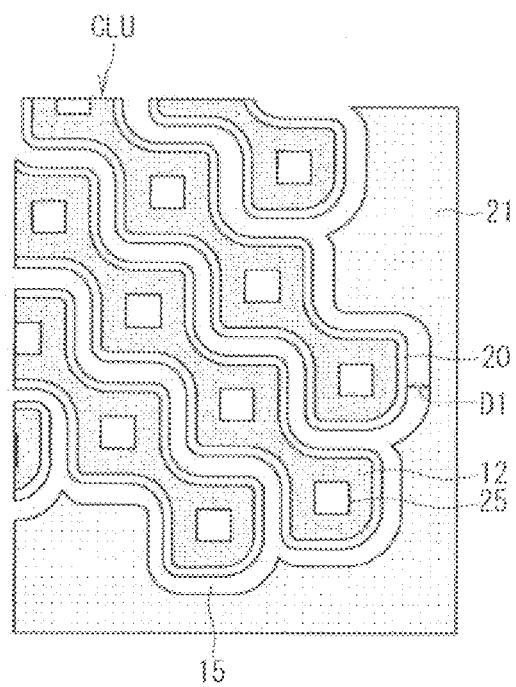
FIG. 17 is a plan view showing the structure of a terminal portion of the unit chain structure of the silicon carbide semiconductor device according to the first embodiment of the present invention.

In the structure of FIG. 17, for example, the terminal portion of the arrangement of the unit chain structure CLU is surrounded by the JFET region 15 such that the well region 20 of the unit chain structure CLU is not connected to the terminal well region 21. Further, a distance D1 between the outer edge of the well region 20 and that of the terminal well region 21 spaced from each other is determined to be equal to or shorter than the JFET length Lj. In particular, if the well region 20 and the terminal well region 21 have the same impurities of the second conductivity type, making the distance D1 between the outer edge of the well region 20 and that of the terminal well region 21 equal to Lj realizes the uniform JFET length Lj throughout the active region AR of the silicon carbide MOS transistor including the terminal portion. This achieves the effect of increasing the reliability of the semiconductor device as it realizes a uniform ON current distribution or a uniform electric field distribution in an oxide film.

Figure 18:
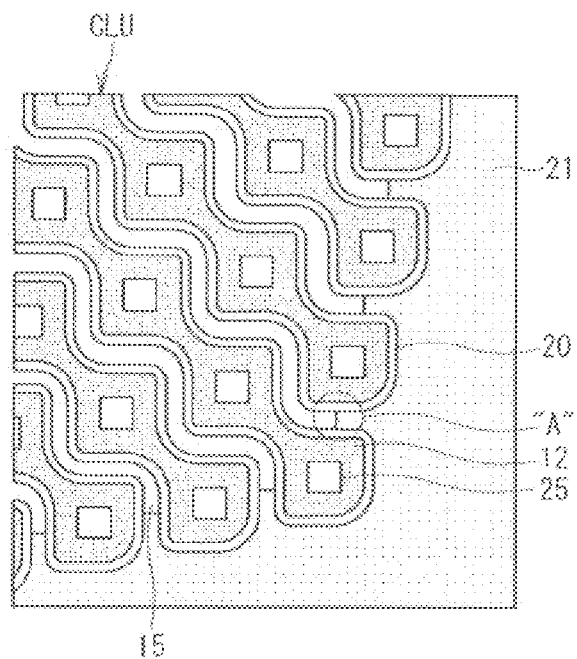
FIG. 18 is a plan view showing the structure of a terminal portion of the unit chain structure of the silicon carbide semiconductor device according to the first embodiment of the present invention.

Alternatively, a structure such as that shown for example in FIG. 18 is applicable where the JFET region 15 discontinues at the terminal portion of the unit chain structure CLU and the terminal well region 21 gets into the terminal portion, so that the well region 20 becomes connected to the terminal well region 21. In this case, it is desirable that the outer edge of the terminal well region 21 be orthogonal to the well region 20 in a linear part of the unit cell UC at the terminal portion of the unit chain structure CLU. This structure can maintain the JFET length at Lj even in an area where the terminal well region 21 and the well region 20 are connected, thereby achieving the same effect as that of the structure of FIG. 17.

In the structure of FIG. 18, the JFET region 15 discontinues at the terminal portion of the unit chain structure CLU. This structure does not form a channel region, so that the source region 12 becomes unnecessary in an area surrounded by the terminal well region 21. Thus, the unit cell UC can employ a structure at the terminal portion of the unit chain structure CLU shown in FIG. 19 where the source region 12 is not formed in an area surrounded by the terminal well region 21 but the well region 20 is formed instead in this area.

As shown in FIGS. 18 and 19, employing the structure where the well region 20 and the terminal well region 21 are connected at the terminal portion of the unit chain structure CLU achieves the aforementioned effect of providing a uniform ON current distribution or a uniform electric field distribution in an oxide film to increase the reliability of the semiconductor device. Additionally, even if ohmic contact with the well contact region 25 is not formed favorably in the unit chain structure CLU, ohmic contact can be formed in the terminal low-resistance region 28 that is a relatively wide region formed near the surface of the terminal well region 21 at the periphery of the active region AR. This can prevent occurrence of a high electric field due to potential fluctuations of the well region 20 during switching operation or delay of switching operation, and damage on the semiconductor device due to the high electric field.

FIG. 20 shows a structure including the unit chain structure CLU with the well region 20 and the terminal well region 21 are connected at the terminal portion of this unit chain structure CLU, and the unit chain structure CLU with the well region 20 and the terminal well region 21 not connected at the terminal portion of this unit chain structure CLU. In this structure, these unit chain structure structures CLU are arranged alternately.

The unit chain structure CLU with the well region 20 and the terminal well region 21 not connected at the terminal portion of this unit chain structure CLU is formed such that the distance D1 between the outer edge of the well region 20 and that of the terminal well region 21 becomes equal to the JFET length Lj.

Unlike the structure of FIG. 17, this structure does not form an area of the terminal well region 21 projecting sharply at a boundary part with the JFET region 15 of each unit chain structure CLU.

Unlike the structures of FIGS. 18 and 19, in the aforementioned structure, the JFET region 15 does not discontinue but it is formed continuously at the terminal portion. This does not form peculiarity such as the end portion of the JFET region 15 to achieve a uniform electric field distribution in an oxide film, thereby increasing the reliability of the semiconductor device further.

Figure 21:
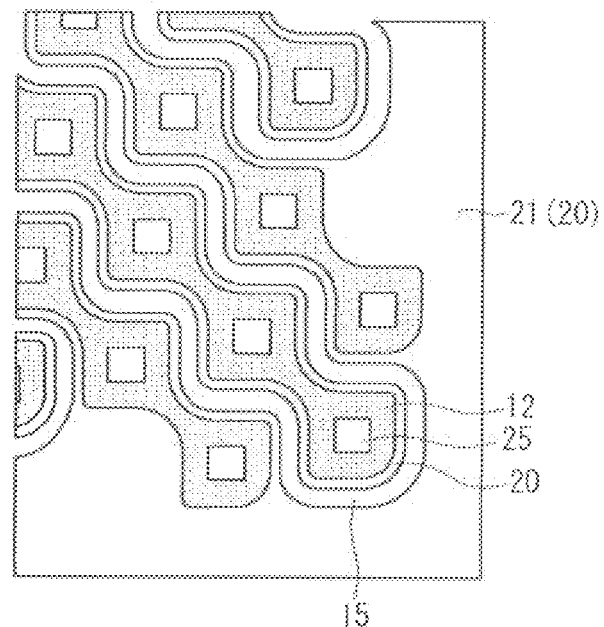
FIG. 21 is a plan view showing the structure of a terminal portion of the unit chain structure of the silicon carbide semiconductor device according to the first embodiment of the present invention.

FIG. 21 shows a structure including the arrangement of the unit chain structures CLU of FIG. 20 and where the terminal well region 21 and the well region 20 are formed simultaneously.

Figure 22:
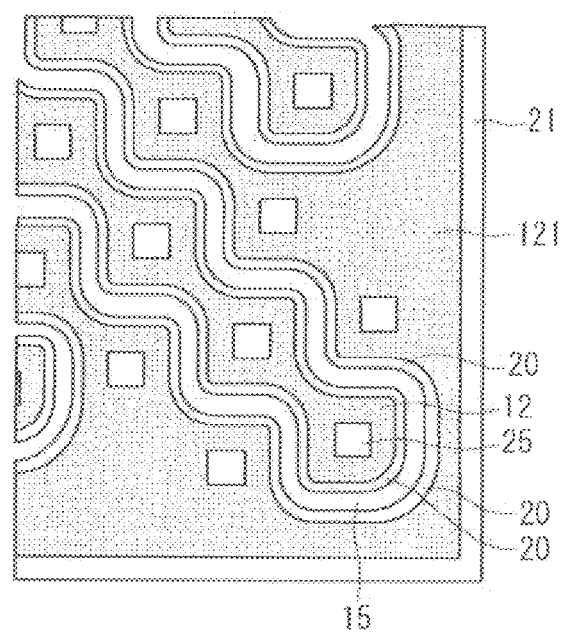
FIG. 22 is a plan view showing the structure of a terminal portion of the unit chain structure of the silicon carbide semiconductor device according to the first embodiment of the present invention.

FIG. 22 shows a structure including the arrangement of the unit chain structures CLU of FIG. 20 and where the end portion of the unit chain structure CLU is surrounded not by the terminal well region 21 but by a terminal source region 121. In this case, in the unit chain structure CLU where its terminal portion is not surrounded by the JFET region 15, the source region 12 in the unit chain structure CLU and the terminal source region 121 are integrated. The terminal well region 21 is formed at the outermost periphery of the active region.

In the unit chain structure CLU where its terminal portion is surrounded by the JFET region 15, the well region 20 of the width Lc exists between the outer edge of the JFET region 15 and the terminal source region 121. This provides a structure with excellent symmetrical properties as viewed from the JFET region 15 while increasing a channel region further. As a result, reliability can be increased and ON resistance can be reduced further.

FIGS. 20 to 22 show the structure of one terminal portion of the unit chain structure CLU. The other terminal portion may have the same structure as that of the former terminal portion, or the opposite terminal portions may form a nested structure.

Figure 23:
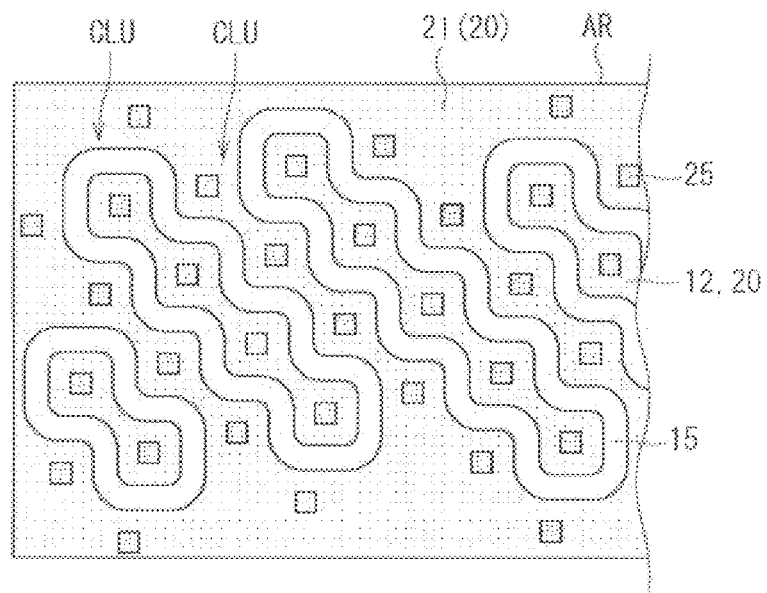
FIG. 23 is a plan view showing the structure of a terminal portion of the unit chain structure of the silicon carbide semiconductor device according to the first embodiment of the present invention.

Specifically, as shown in FIG. 23, the active region AR of the silicon carbide MOS transistor 100 may include the unit chain structure CLU with the opposite terminal portions not contacting the terminal well region 21 and the unit chain structure CLU with the opposite terminal portions contacting the terminal well region 21, and these unit chain structures CLU may be arranged alternately. Further, as shown in FIG. 24, the unit chain structure CLU may have one terminal portion contacting the terminal well region 21 and the other terminal portion not contacting the terminal well region 21, and such unit chain structures CLU may be arranged in a nested pattern.

In the structure of FIG. 23, the JFET region 15 surrounds the well region 20 in an annular pattern and this structure does not form peculiarity such as the end portion of the JFET region 15. This achieves a uniform electric field distribution in an oxide film, thereby increasing the reliability of the semiconductor device further.

Figure 24:
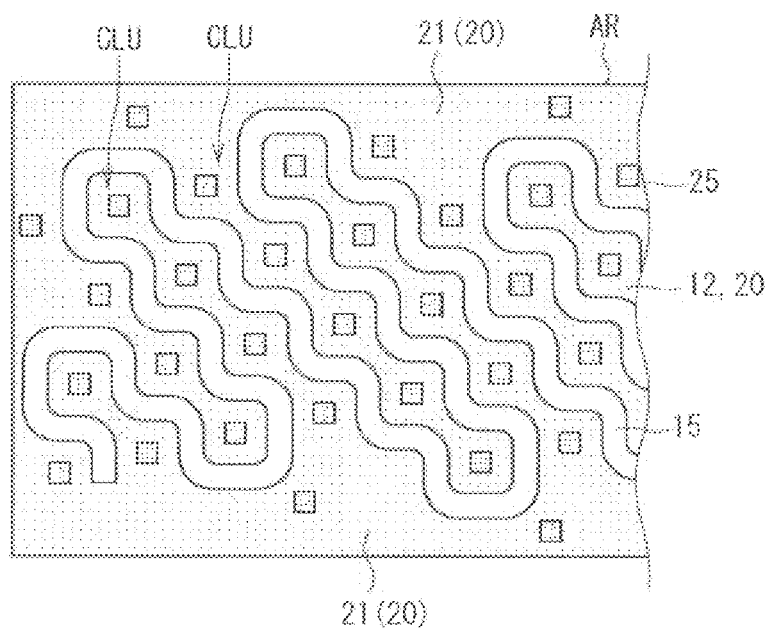
FIG. 24 is a plan view showing the structure of a terminal portion of the unit chain structure of the silicon carbide semiconductor device according to the first embodiment of the present invention.

In the structure of FIG. 24, the well region 20 of the unit chain structure CLU is always connected to the terminal well region 21 or the well region 20 taking the place of the terminal well region 21. This can fix the potential of the well region 20 more reliably, so that damage on the semiconductor device due to occurrence of a high electric field can be prevented.

<Modifications>

In the aforementioned silicon carbide MOS transistor 100 of the first embodiment, the active region AR is substantially rectangular and analogous to the shape of the source pad 41 in plan view. The unit chain structures CLU are arranged in an offset pattern so as to form an angle of 45 degrees relative to one side (any of right, left, upper, and lower sides) of the active region AR. However, this is not the only arrangement of the unit chain structures CLU.

Figure 25:
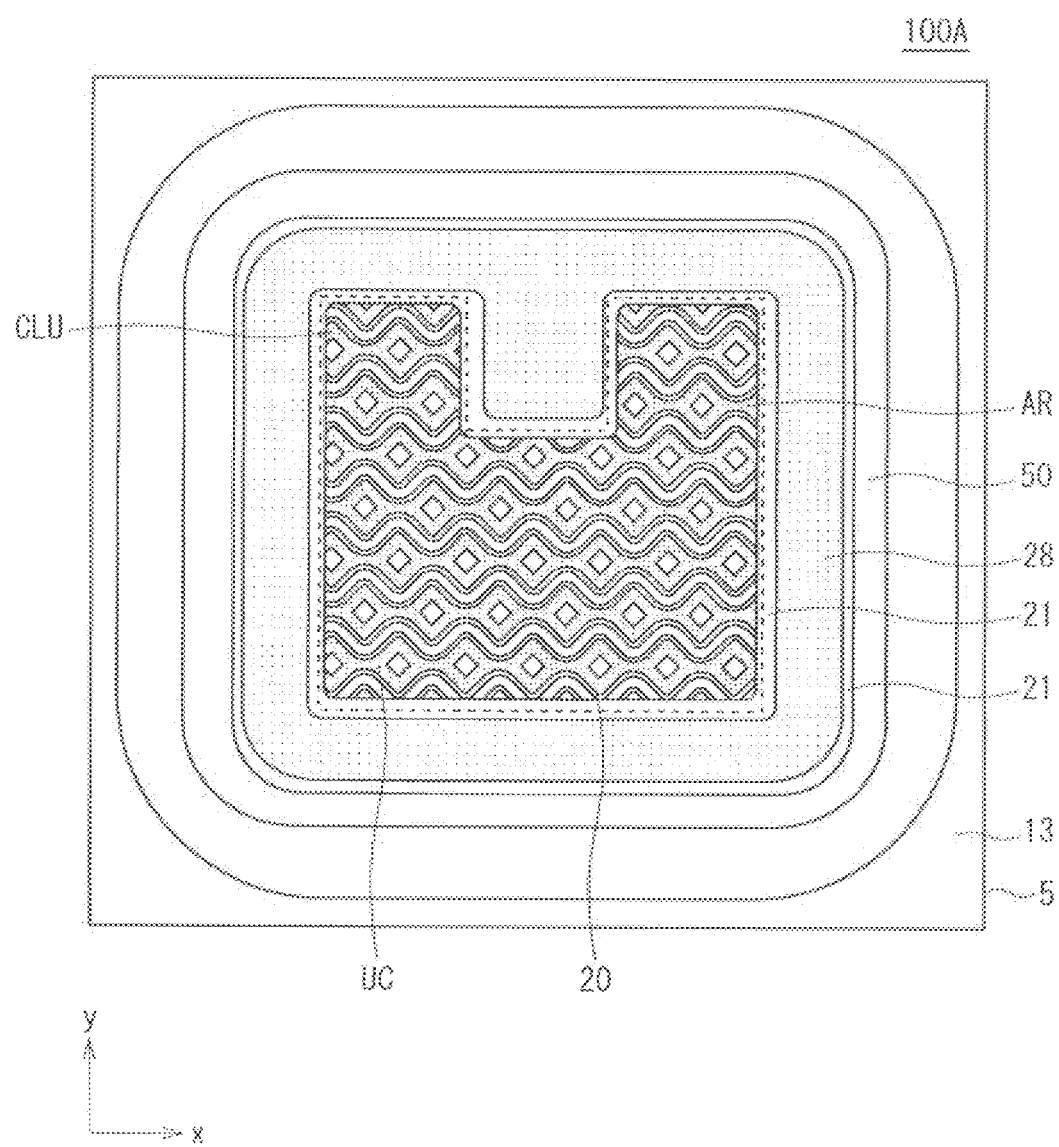
FIG. 25 is a plan view schematically showing each impurity region according to a modification of the silicon carbide semiconductor device of the present invention.
Figure 26:
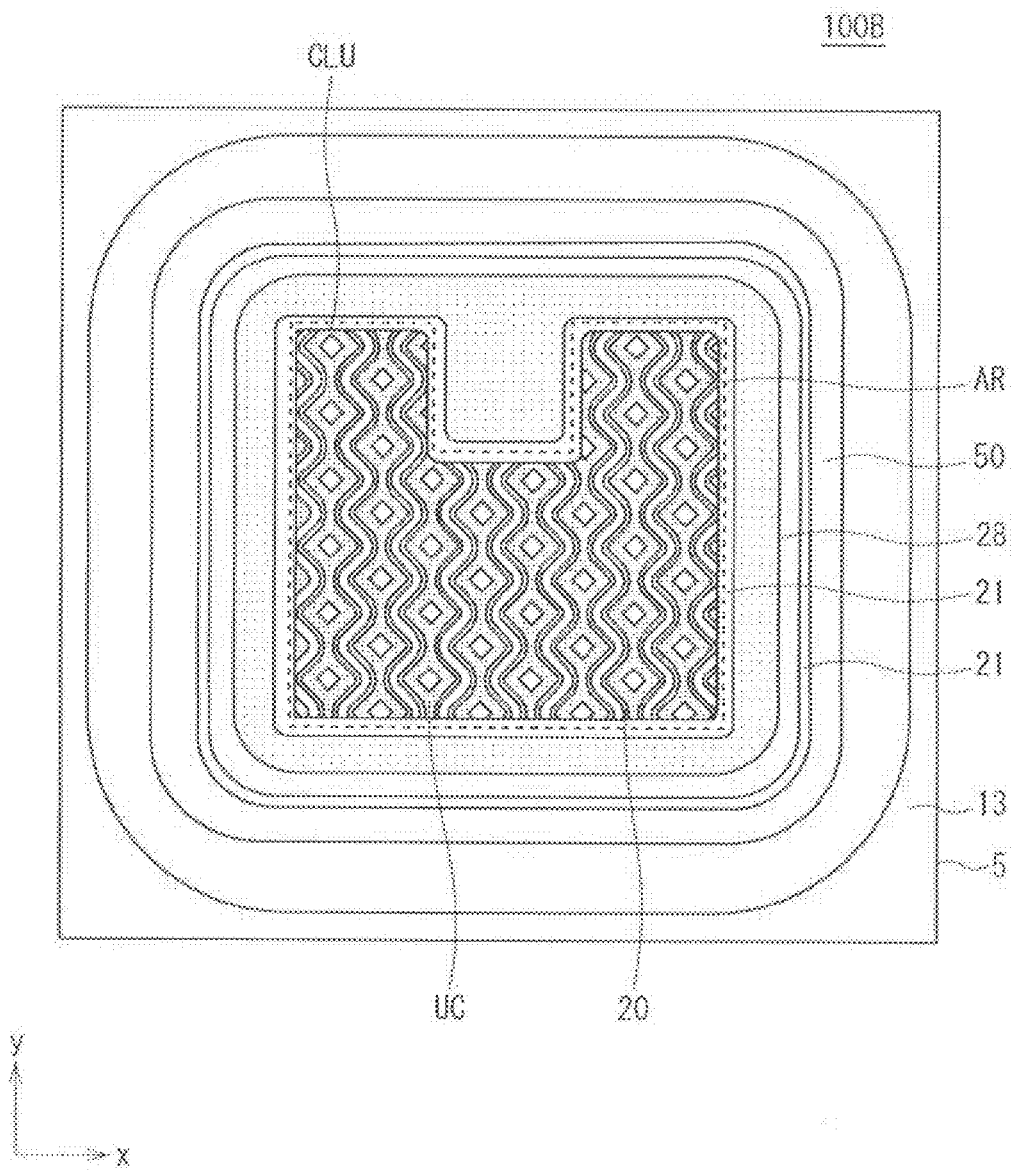
FIG. 26 is a plan view schematically showing each impurity region according to a modification of the silicon carbide semiconductor device of the present invention.

Specifically, like in a silicon carbide MOS transistor 100A shown in FIG. 25, the unit chain structures CLU may be arranged in a staggered pattern so as to extend in the horizontal (x) direction. Further, like in a silicon carbide MOS transistor 100B shown in FIG. 26, the unit chain structures CLU may be arranged in a staggered pattern so as to extend in the vertical (y) direction. In FIGS. 25 and 26, structures same as those of the silicon carbide MOS transistor 100 of FIG. 3 are identified by the same signs and will not be described repeatedly.

The following describes effects achieved by these structures in comparison to the silicon carbide MOS transistor 100 of FIG. 3.

It is assumed for example that the surface orientation of the semiconductor substrate 1 tilts in the C-axis direction and the horizontal direction (x direction) is the off direction as viewed from a side facing FIG. 3 (FIGS. 25 and 26). In this case, in the silicon carbide MOS transistor 100 of FIG. 3, well regions 20 at the four sides of each unit cell UC include well regions 20 at the two sides parallel to the vertical direction (y direction), and these two well regions 20 are vertical to the off direction. Hence, collision ionization resulting from the crystal orientation of the semiconductor substrate 1 is occurred with a likelihood differing between right and left well regions 20 in one unit cell UC, or between two well regions 20 belonging to adjacent unit cells UC and facing each other while the JFET region 15 is placed therebetween. This might cause imbalance as a breakdown voltage drops in a well region 20 where collision ionization is occurred more likely.

In contrast, if the unit chain structures CLU are arranged in a staggered pattern to extend in the horizontal (x) and vertical (y) directions as shown in FIGS. 25 and 26, regions where collision ionization is occurred with different likelihoods are defined not as linear regions but as dots. This reduces effect that might cause imbalance of a breakdown voltage, making it possible to increase reliability during application of a high drain bias, for example.

A similar effect can be achieved by a structure where the connection width (Lss) of the source region 12 is large so that no linear part is formed in the unit cell UC of FIG. 5, or by a structure where the unit chain structures CLU arranged in an offset pattern are at an angle of from zero to an angle less than 45 degrees or at an angle of from 45 degrees to an angle less than 90 degrees relative to the off direction.

<Manufacturing Method>

A method of manufacturing the silicon carbide MOS transistor 100 of the first embodiment is described next by referring to the sectional view of FIGS. 27 to 33 showing manufacturing steps in order. The sectional views of FIGS. 27 to 33 are views taken along line B-B of FIGS. 1 and 3 and resulting from cutting of two adjacent unit cells UC as shown in FIG. 3

First, a silicon carbide substrate containing impurities of the first conductivity type is prepared as the semiconductor substrate 1. An applicable material for the semiconductor substrate 1 includes silicon carbide and a wide band-gap semiconductor wider in band gap than silicon (Si). Examples of a different wide band-gap semiconductor include a gallium nitride based material, an aluminum nitride based material, and diamond.

A switching device or a diode including such a wide band-gap semiconductor as a material for a substrate has high resistance to a breakdown voltage and a high allowable current density. Thus, such a switching device or a diode can be made smaller in size than a silicon semiconductor device. Using such a small-sized switching device or diode allows size reduction of a semiconductor device module with this switching device or diode.

The aforementioned switching device or diode has high resistance to heat. This allows size reduction of a radiation fin of a heat sink and cooling with air not using water, thereby achieving further size reduction of the semiconductor device module.

The surface orientation of the semiconductor substrate 1 may tilt to eight degrees or less or it may not tilt in the C-axis direction. The semiconductor substrate 1 may have any surface orientation.

Next, in the step of FIG. 7, a silicon carbide epitaxial layer of the first conductivity type is formed by epitaxial crystal growth on upper part of the semiconductor substrate 1 to form the drift layer 2. The drift layer 2 of the first conductivity type has an impurity concentration for example of from $1 \times 10^{13}$ to $1 \times 10^{18}$ cm$^{-3}$ and has a thickness of from 4 to 200 μm.

Next, a resist material is applied (or a silicon oxide film is formed) on the main surface of the drift layer 2. Then, the resist material is patterned by photolithography (and by etching) to form an implantation mask RM1 having an opening in an area corresponding to the well regions 20 and the terminal well region 21 (FIG. 2). Then, impurity ions of the second conductivity type are implanted using the implantation mask RM1, thereby forming the well regions 20 and the terminal well region 21 (FIG. 3).

During implantation of the impurity ions, the semiconductor substrate 1 may not be heated positively or may be heated to a temperature of from 100 to 800° C. It is preferable that the impurities to be implanted be nitrogen (N) or phosphorus (P) if the first conductivity type is a n-type. It is preferable that the impurities to be implanted be aluminum (Al) or boron (B) if the first conductivity type is a p-type.

The depth of the well regions 20 is set so as not to be deeper than the bottom surface of the drift layer 2, and determined in a range of from 0.3 to 2.0 μm, for example.

The impurity concentration of the well regions 20 is set so as to exceed the impurity concentration of the drift layer 2, and is determined in a range of from $1 \times 10^{15}$ to $1 \times 10^{19}$ cm$^{-3}$, for example. In order to enhance the conductive properties of the silicon carbide MOS transistor 100 in a channel region, the concentration of the impurities of the second conductivity type in the well regions 20 can be lower only in areas nearest the surfaces of the well regions 20 than the concentration of the impurities of the first conductivity type in the drift layer 2.

Specifically, if the concentration of impurities of the first conductivity type is relatively higher than that of impurities of the second conductivity type in a channel region, carriers (if the first conductivity type is a n-type, electrons) exist more accordingly, thereby enhancing the conductive properties of the channel.

This structure can be achieved by implanting the impurity ions of the second conductivity type for forming the well regions 20 to form a profile that has a concentration peak at a deep area of the drift layer 2. This way works effectively in silicon carbide semiconductor as impurities are scarcely diffused by heat as a result of thermal process.

Figure 27:
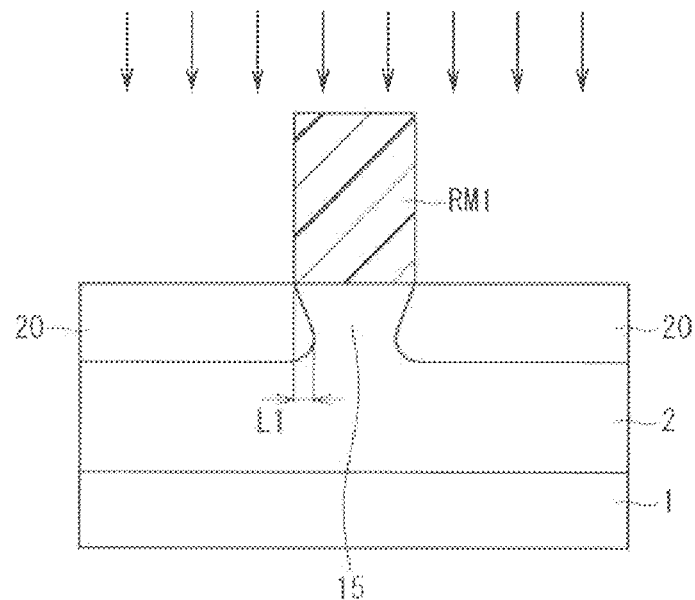
FIG. 27 is a sectional view showing a step of manufacturing the silicon carbide semiconductor device according to the first embodiment of the present invention.

As shown in FIG. 27, the well regions 20 have a trapezoidal shape in cross section with a wider bottom surface and a narrower upper surface. This shape is formed for the reason as follows. Even if impurity ions are implanted using the strictly vertical implantation mask RM1 as shown in FIG. 27, the impurity ions are implanted at highly accelerated energy promotes scattering in the horizontal direction (direction horizontal to the main surface of the substrate 1) in the drift layer 2. Thus, without the need of implanting the impurity ions from a tilting direction intentionally relative to the substrate, the end surfaces become a tapered shape to form the trapezoidal well regions 20.

A distance L1 shown in FIG. 27 determined by the implanted impurities spreading in the horizontal direction from an end of the implantation mask RM1 is about 0.3 μm. This value is obtained by accelerated energy of 500 keV for the impurity ions, for example.

As a result of formation of the aforementioned tapered shape at the end surfaces of the well regions 20, a depletion layer extending from a position near the vertex of the end surface of the tapered shape accelerates shielding effect achieved by the JFET region 15 during turn-of of the silicon carbide MOS transistor 100. This reduces an electric field to be applied during turn-off to the gate insulating film 30 (FIG. 2) formed later, thereby increasing the reliability of the silicon carbide MOS transistor 100.

As described previously, the strictly vertical implantation mask RM1 shown in FIG. 27 is used while impurity ions of the second conductivity type are implanted for forming the well regions 20 to form a profile that has a concentration peak at a deep area of the drift layer 2. This achieves the effect as follows.

If an implantation mask is not strictly vertical, the implantation mask might cover an area above the well region 20 to become a channel region later. In this case, the impurity ions of the second conductivity type are implanted through a tapered part of a side surface of the implantation mask RM1, so that even relatively shallow areas of the well regions 20 become areas of a high impurity concentration. This makes it impossible to enhance the conductive properties of the channel, so that a threshold voltage cannot be reduced and channel resistance cannot be reduced. If the implantation mask RM1 is strictly vertical, deep areas of the well regions 20 can become areas of a high impurity concentration. This enhances the conductive properties of the channel, thereby achieving the silicon carbide MOS transistor 100 with a low threshold voltage and low channel resistance.

While not shown in the drawings, the implantation mask RM1 is removed thereafter and next, a resist material is applied (or a silicon oxide film is formed) on the main surface of the drift layer 2. The resist material is patterned by photolithography (and by etching) to form an implantation mask having an opening in an area corresponding to the JTE region 50 (FIG. 2). Then, impurity ions of the second conductivity type are implanted using this implantation mask, thereby forming the JTE region 50.

Figure 28:
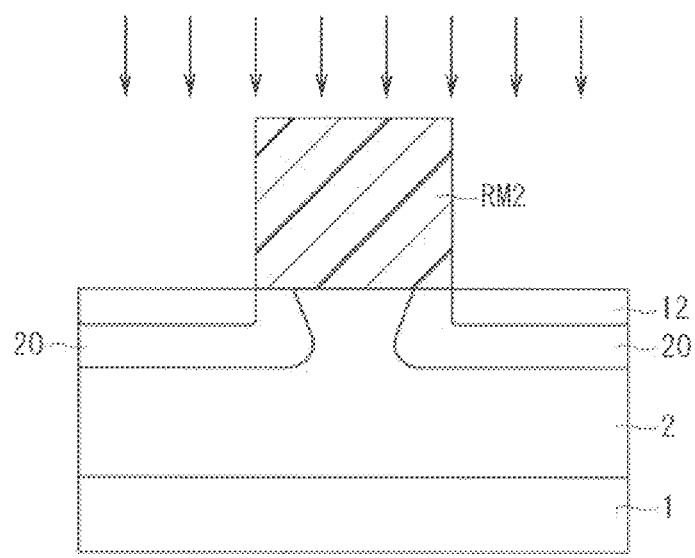
FIG. 28 is a sectional view showing a step of manufacturing the silicon carbide semiconductor device according to the first embodiment of the present invention.
Figure 29:
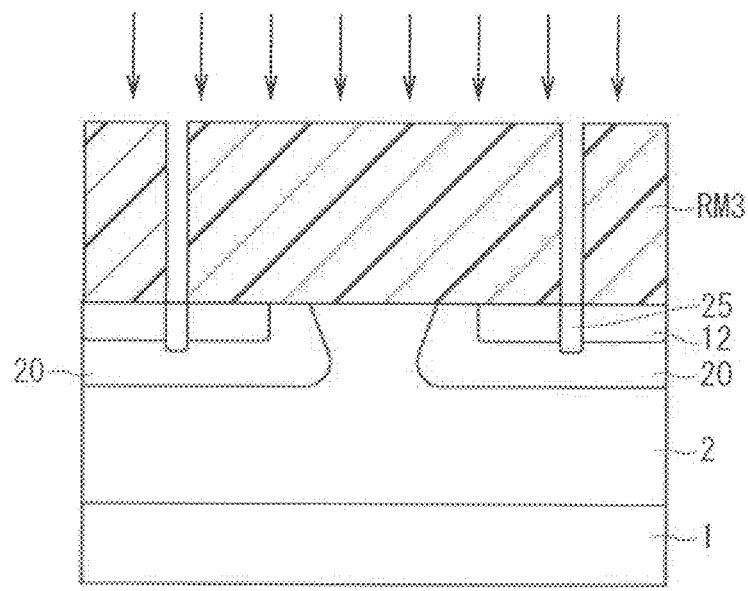
FIG. 29 is a sectional view showing a step of manufacturing the silicon carbide semiconductor device according to the first embodiment of the present invention.

Next, in the step of FIG. 28, a resist material is applied (or a silicon oxide film is formed) on the main surface of the drift layer 2. The resist material is patterned by photolithography (and by etching) to form an implantation mask RM2 having an opening in an area corresponding to the source regions 12 and the field stop region 13 (FIG. 2). Then, impurity ions of the first conductivity type are implanted using the implantation mask RM2, thereby forming the source regions 12 and the field stop region 13 (FIG. 2).

The depth of the source regions 12 is determined such that the bottom surfaces of the source regions 12 will not be deeper than the bottom surfaces of the well regions 20. The concentration of the impurities of the first conductivity type is set so as to exceed an impurity concentration in the well regions 20 and is determined in a range of from $1 \times 10^{17}$ to $1 \times 10^{21}$ cm$^{-3}$, for example. This also applies to the field stop region 13.

The implantation mask RM2 is removed thereafter. Then, in the step shown in FIG. 29, a resist material is applied (or a silicon oxide film is formed) on the main surface of the drift layer 2. The resist material is patterned by photolithography (and by etching) to form an implantation mask RM3 having an opening in an area corresponding to the well contact regions 25. Then, impurity ions of the second conductivity type are implanted using the implantation mask RM3, thereby forming the well contact regions 25 in the well regions 20.

The well contact regions 25 function to realize favorable metallic contact between the well regions 20 and the source pad 41 (FIG. 2). The well contact regions 25 are formed so as to be higher in impurity concentration than the well regions 20.

It is desirable that these ions be implanted while the substrate is placed in a temperature of 150° C. or more. Setting the substrate in such a temperature forms regions of the second conductivity type having low sheet resistance.

The terminal low-resistance region 28 (FIG. 2) can be formed in the surface of the terminal well region 21 (FIG. 2) simultaneously with the well contact regions 25. This can realize favorable metallic contact with the source pad 41 (FIG. 2) and reduce parasitic resistance in a terminal region, thereby realizing a structure having excellent resistance to dV/dt (fluctuations of a drain voltage V relative to time t), for example.

The terminal low-resistance region 28 is certainly not required to be formed simultaneously with the well contact regions 25.

Figure 30:
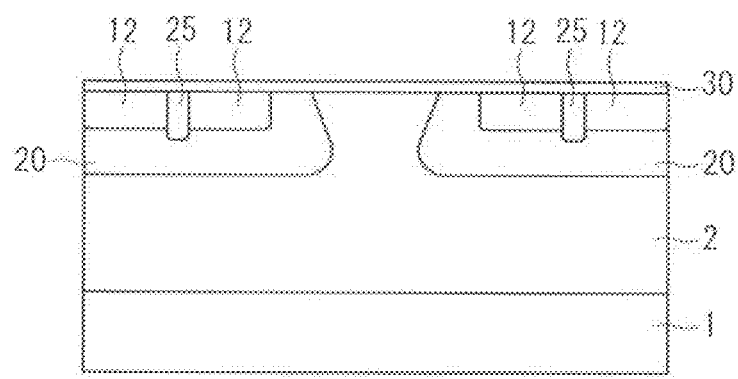
FIG. 30 is a sectional view showing a step of manufacturing the silicon carbide semiconductor device according to the first embodiment of the present invention.
Figure 31:
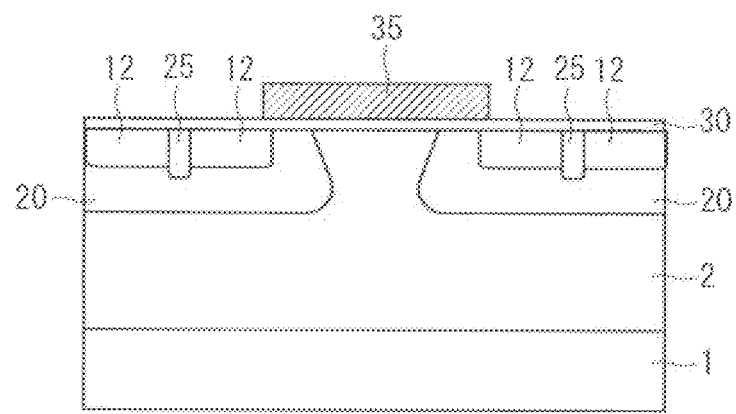
FIG. 31 is a sectional view showing a step of manufacturing the silicon carbide semiconductor device according to the first embodiment of the present invention.

As a result of the aforementioned steps, the source regions 12 and the well contact regions 25 are formed as shown in FIG. 30.

Next, thermal process is performed for 0.5 to 60 minutes in an atmosphere of an inactive gas such as argon or nitrogen or in a vacuum atmosphere and in a temperature of a range of from 1500° C. to 2200° C., thereby electrically activating the implanted impurities. This thermal process may be performed while a film containing carbon covers the surface of the drift layer 2, or the surface of the drift layer 2 and the rear surface and an end surface of the semiconductor substrate 1. This prevents the surface of the drift layer 2 from being exposed to etching with residual water or residual oxygen in the process device, for example, thereby preventing roughening of the surface of the drift layer 2.

Next, a silicon oxide film is formed by thermal oxidation on the entire surface of the drift layer 2. Then, the silicon oxide film is removed with hydrofluoric acid. This removes a surface alteration layer on the drift layer 2 to obtain a clean surface. Then, a silicon oxide film is deposited on the entire surface of the drift layer 2 for example by CVD (chemical vapor deposition) process and the silicon oxide film is patterned such that an opening is formed only in an area corresponding to the active region AR (FIG. 3), thereby forming the field oxide film 31 covering an area except the active region AR (FIG. 3). The field oxide film 31 is formed to a thickness of from 0.5 to 2 μm.

Next, in the step of FIG. 30, a silicon oxide film is formed on the drift layer 2 by thermal oxidation process or CVD process. This silicon oxide film is subjected to thermal process in an atmosphere of a nitrogen oxide gas such as NO or $N_2O$ or an ammonia atmosphere and thermal process in an inactive gas such as argon, thereby forming the gate insulating film 30.

Next, a polysilicon layer to become a gate electrode material is deposited for example by CVD process on the gate insulating film 30 and the field oxide film 31 (FIG. 2). A resist material is applied on the polysilicon layer and is patterned by photolithography, thereby forming an etching mask having an opening in an area except an area where a gate electrode is to be formed. The polysilicon layer is etched using the etching mask, thereby obtaining the gate electrode 35 shown in FIG. 31.

It is desirable that the polysilicon layer have low sheet resistance as a result of existence of phosphorus or boron. Phosphorus or boron may be brought into the polysilicon layer during deposition of the polysilicon layer. Phosphorus or boron may be introduced by ion implantation and then activated by subsequent thermal process. The gate electrode 35 may be a multilayer film composed of polysilicon, metal, and an intermetallic compound.

Figure 32:
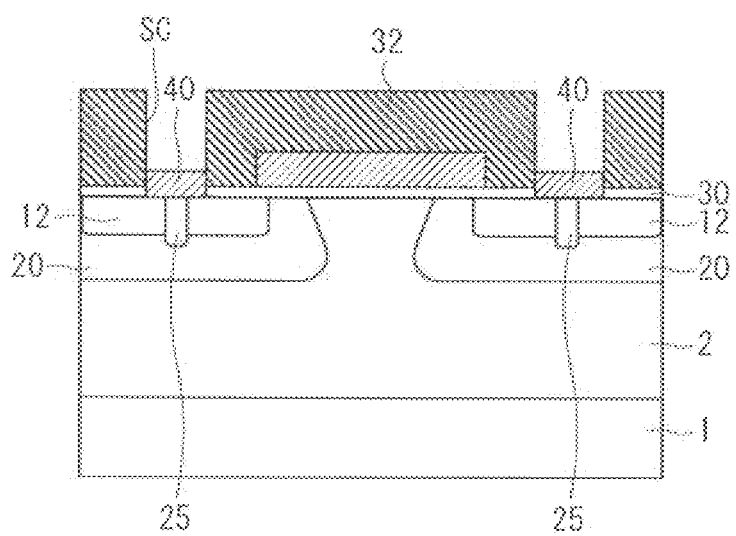
FIG. 32 is a sectional view showing a step of manufacturing the silicon carbide semiconductor device according to the first embodiment of the present invention.

Next, in the step of FIG. 32, a silicon oxide film is deposited for example by CVD process on the entire surface of the drift layer 2 and the deposited silicon oxide film becomes the interlayer insulating film 32. Then, the source contact holes SC are formed so as to reach places above the source regions 12 and the well contact regions 25. Further, the well contact hole WC (FIG. 2) is formed so as to reach a place above the terminal low-resistance region 28. In this step, the gate contact hole GC (FIG. 2) may be formed simultaneously so as to reach a place above the gate electrode 35 (FIG. 2) on the terminal low-resistance region 28. This can simplify process steps to reduce manufacturing cost.

The source contact holes SC are filled with the source pad 41 (FIG. 2) later and the gate contact hole GC is filled with the gate interconnect 44 (FIG. 2) later.

Then, a metal film is formed for example by sputtering process on the interlayer insulating film 32. Accordingly, this metal film is further formed on the bottoms of the source contact holes SC in the interlayer insulating film 32 and the bottom of the well contact hole WC (FIG. 2).

This metal layer is to become the ohmic electrode 40 later and is mainly made of nickel (Ni). Next, thermal process of from 600° C. to 1100° C. is performed to form silicide with silicon carbide. The metal film remaining on the interlayer insulating film 32 is removed by wet etching using nitric acid, fluoric acid or hydrochloric acid, or using a compound liquid of these acids and oxygenated water. As a result, as shown in FIG. 32, the nickel silicide ohmic electrodes 40 are formed on the bottoms of the source contact holes SC and on the bottom of the well contact hole WC (FIG. 2).

Thermal process may be performed again after the metal film remaining on the interlayer insulating film 32 is removed. This thermal process is performed in a temperature higher than the temperature for the thermal process performed previously, thereby forming ohmic contact of lower contact resistance.

During the step of forming the ohmic electrodes 40, a similar metal film may be formed further on the rear surface of the semiconductor substrate 1 to form the ohmic electrode 42 (FIG. 2) by thermal process. Forming the ohmic electrode 42 in this way achieves favorable ohmic contact between the silicon carbide semiconductor substrate 1 and the drain electrode 43.

The ohmic electrodes 40 may be composed of the same intermetallic compound (silicide) in any place, or may be composed of different intermetallic compounds appropriate for a p-type semiconductor layer and an n-type semiconductor layer.

Specifically, in order to reduce ON resistance of the silicon carbide MOS transistor 100, it is important for the ohmic electrodes 40 to have sufficiently low resistance of ohmic contact with the source regions 12 of the first conductivity type. Meanwhile, in order to fix the well regions 20 at the earth potential and to enhance the forward characteristics of a body diode built in the silicon carbide MOS transistor 100, it is also important for the ohmic electrodes 40 to have low resistance of contact with the well contact regions 25.

As an example, an intermetallic compound of nickel and silicon is suitable for the n-type semiconductor layer, whereas an intermetallic compound of titanium, aluminum and silicon is suitable for the p-type semiconductor layer.

In order to make the ohmic electrodes 40 using a material differing between the source regions 12 of the first conductivity type and the well contact regions 25 of the second conductivity type, metal films suitable for the source regions 12 and the well contact regions 25 may be patterned on the source regions 12 and the well contact regions 25, and these metal films may be subjected to thermal process simultaneously. As a result, different silicides can be formed on the source regions 12 and the well contact regions 25.

As described previously, if the gate contact hole GC (FIG. 2) is formed simultaneously with the source contact holes SC and the well contact hole WC (FIG. 2) and if the gate electrode 35 exposed at the bottom surface of the gate contact hole GC is made of polysilicon, silicide is further formed on the bottom surface of the gate contact hole GC.

The gate contact hole GC may be formed separately. In this case, the gate contact hole GC is formed by photolithography and etching after formation of the ohmic electrodes 40. Accordingly, silicide is not formed on the bottom surface of the gate contact hole GC.

Next, Al, Ag (silver), Cu (copper), Ti (titanium), Ni (nickel), Mo (molybdenum), W (tungsten) and Ta (tantalum), nitrides or stacked films of these materials, and interconnect metals composed of alloys of these materials are formed by sputtering process or deposition process on the interlayer insulating film 32, and then patterned. As a result, the source pad 41 shown in FIG. 33, the gate interconnect 44 (FIG. 2), and the gate pad 45 (FIG. 1) are formed.

Further, the drain electrode 43 is formed by forming a metal film made for example of Ti, Ni, Ag or Au (gold) on the ohmic electrode 42 on the rear surface of the semiconductor substrate 1, thereby completing formation of the silicon carbide MOS transistor 100 of FIG. 33.

While not shown in the drawings, a front surface may be covered with a silicon nitride film or a polyimide protective film. In order to form connection to an external control circuit, these films have openings formed at appropriate positions in the gate pad 45 and the source pad 41.

<Summary of Effects>

As described above, in the silicon carbide MOS transistor 100 of the first embodiment, the unit cells UC are defined into a certain shape in plan view at the main surface of the drift layer 2, and the unit cells UC are coupled to form a chain structure with constrictions, thereby forming the unit chain structure CLU. The certain shape of a unit cell is defined by the outer edge of the virtual region of the drift layer 2 defined so as to include the source region 12 and the well region 20 inside and by the respective outer edges of the source region 12 and the well region 20 at a joint with a different unit cell. The active region AR is composed of the unit chain structures CLU that are arranged so as to avoid generation of a gap between the unit cells of adjacent unit chain structures CLU. This increases a channel width density and reduces ON resistance, thereby achieving resistance reduction. This further reduces a reverse transfer capacitance to reduce switching power dissipation, which works advantageously for high-speed switching operation.

A distance between the well regions 20 in adjacent unit chain structures CLU is uniform in the active region AR, so that resistance in the JFET region 15 generated during ON operation becomes uniform throughout the region. This prevents imbalance of a current distribution determined during ON operation, so that the reliability of the semiconductor device can be increased while a current-conducting state continues, for example.

Local occurrence of a high electric field in the gate insulating film 30 is inhibited during turn-off operation due to nonuniformity of the JFET length. As a result, reliability can be increased during application of a high drain bias, for example.

In the silicon carbide MOS transistor 100 of the first embodiment, the certain shape of a unit cell is a hexagonal shape with a pair of opposite corners both having an internal angle of 90 degrees. Two opposite sides except sides forming the corners form joints. Unit lattices are coupled at the joints to connect the source region 12 and the well region 20 in the unit chain structure CLU. In the unit cell UC, the well region 20 extends along the outer edge of the source region 12. The respective outer edges of the source region 12 and the well region 20 extend linearly along the sides forming the corners. In each of areas facing the corners, the source region 12 and the well region 20 form the arcuate projections DP of a central angle of 90 degrees having the same center of curvature M and the different radii of curvature r1 and r2 respectively. The distance Lc between the respective outer edges of the well region 20 and the source region 12 is set to be a distance corresponding to a difference between the radii of curvature r1 and r2 in every area of the unit cell UC.

As a result, a channel length determined by the distance corresponding to the difference between the radii of curvature r1 and r2 becomes uniform throughout the active region AR. This achieves a uniform current distribution determined during ON operation, so that the reliability of the semiconductor device can be increased while a current-conducting state continues, for example.

In the silicon carbide MOS transistor 100 of the first embodiment, the unit chain structure CLU has the arcuate recess CP of a central angle of 90 degrees at a joint between the unit cells UC. In the unit chain structure CLU, the source region 12 and the well region 20 form arcs of a central angle of 90 degrees at the recess CP and these arcs have the same center of curvature N and the different radii of curvature r3 and r4.

In this way, the source region 12 and the well region 20 in adjacent unit chain structures CLU have the same center of curvature at each of the projection and the recess facing each other. As a result, the channel length and the JFET length can be uniform throughout the active region AR.

In the unit chain structure CLU, all the linear outer edges of the well regions 20 in the unit cells UC extend in a direction not vertical to the off direction of the semiconductor substrate 1 and the drift layer 2. This can suppress imbalance of a breakdown voltage due to different likelihoods of occurrence of collision ionization, so that reliability can be increased during application of a high drain bias, for example.

The unit chain structure CLU may have a terminal portion of a structure where the well region 20 in this unit chain structure is connected to the terminal well region 21. The unit chain structure CLU may also have a terminal portion of a structure where the well region 20 in this unit chain structure is not connected to the terminal well region 21. These unit chain structures CLU may be arranged alternately to obtain a structure where the JFET region 15 is formed into an annular shape. This does not form peculiarity such as the end portion of the JFET region 15 to achieve a uniform electric field distribution in a gate oxide film, thereby increasing the reliability of the semiconductor device further during turn-off operation.

The unit chain structure CLU may have a terminal portion of a structure where the source region 12 in this unit chain structure is not connected to the terminal source region 121. The unit chain structure CLU may also have a terminal portion of a structure where the well region 20 in this unit chain structure is connected to the terminal well region 21. In the structure where the source region 12 in the unit chain structure is not connected to the terminal source region 121, the well region 20 is interposed between the drift layer 2 at the terminal portion and the corresponding terminal source region 121 so as to be connected to the well regions 20 in adjacent unit chain structures CLU. This provides a structure with excellent symmetrical properties as viewed from the JFET region 15 while increasing a channel region further. As a result, reliability can be increased and ON resistance can be reduced further.

The unit chain structure CLU may have at least one terminal portion of a structure where the well region 20 in this unit chain structure is connected to the terminal well region 21. Even if favorable ohmic contact is not formed in the unit chain structure CLU, ohmic contact can be formed in a relatively wide region at the periphery. This can prevent occurrence of a high electric field due to potential fluctuations of the well region 20 during switching operation or delay of switching operation, and damage on the semiconductor device due to the high electric field.

The unit chain structure CLU may have opposite terminal portions of a structure where the well region 20 in this unit chain structure is not connected to with the terminal well region 21, and a distance between the well regions in unit chain structures may be uniform and a distance between the well region 20 in a unit chain structure and the terminal well region 21 may be uniform. This makes the JFET length uniform throughout the active region AR including its terminal portion. This can increase the reliability of the semiconductor device as it realizes a uniform ON current distribution or a uniform electric field distribution in a gate oxide film.

<Second Embodiment>

Figure 34:
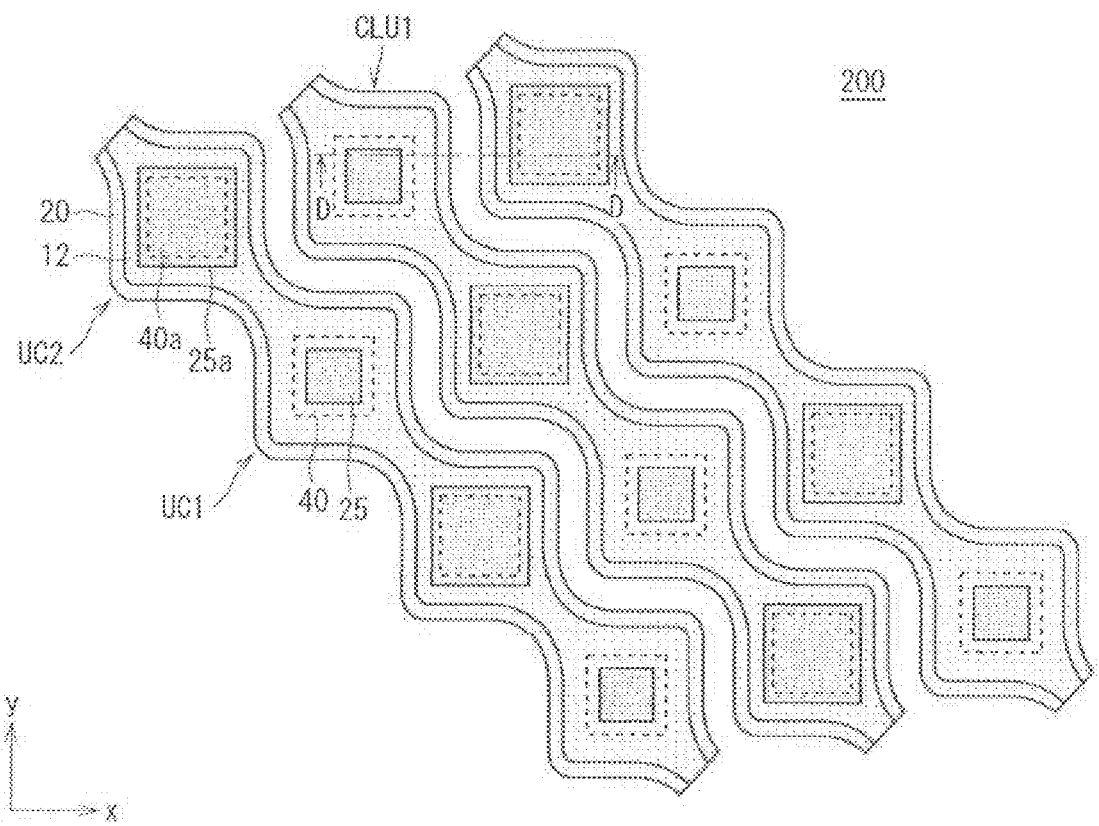
FIG. 34 is a plan view schematically showing an example of arrangement of unit chain structures of a silicon carbide semiconductor device according to a second embodiment of the present invention.
Figure 35:
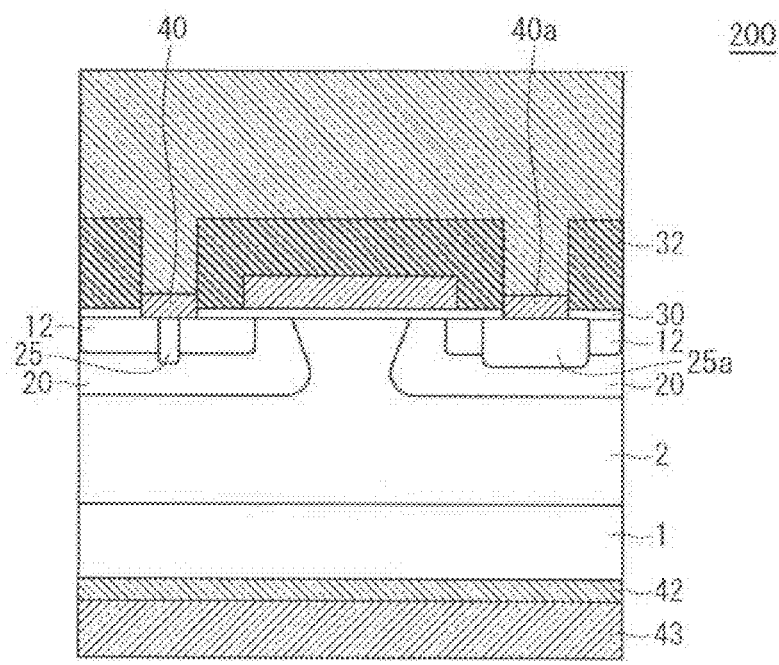
FIG. 35 is a partial sectional view taken at the unit chain structure of the silicon carbide semiconductor device according to the second embodiment of the present invention.

FIG. 34 is a plan view showing arrangement of unit chain structures that form an active region of a silicon carbide MOS transistor 200 of a second embodiment of the present invention. FIG. 34 corresponds to FIG. 7 of the first embodiment. FIG. 35 shows a structure in cross section of the silicon carbide MOS transistor 200 taken along line D-D of FIG. 34. Structures same as those of the silicon carbide MOS transistor 100 of the first embodiment are identified by the same signs and will not be described repeatedly.

In the silicon carbide MOS transistor 200, a unit chain structure CLU1 includes a unit cell UC1 (corresponding to the unit cell UC of the first embodiment) and a unit cell UC2 that are connected alternately. In the unit cell UC1, the ohmic electrode 40 is connected to both the source region 12 and the well contact region 25 provided in the well region 20. The unit cell UC2 has an ohmic electrode 40a connected to only a well contact region 25a provided in the well region 20.

The area of the well contact region 25a is larger in plan view than that of the ohmic electrode 40a and the ohmic electrode 40a is not connected to the source region 12.

Employing the unit chain structure CLU1 connects the ohmic electrode 40a and the well contact region 25a in a wider area in the unit cell UC2. Thus, the potential of the well region 20 is fixed more reliably. This can prevent occurrence of a high electric field due to potential fluctuations of the well region 20 during switching operation caused by contact failure or delay of switching operation, and damage on the semiconductor device due to the high electric field.

The source region 12 is connected to the source pad 41 through the ohmic electrode 40 in the unit cell UC1. This can inhibit considerable increase of ON resistance as long as the sheet resistance of the source region 12 is sufficiently low.

More preferably, forming a low-resistance tunnel junction between the source region 12 and the well contact region 25a provides linear current-voltage characteristics between these regions. Further, ON current to flow during ON operation is caused to pass through the ohmic electrode 40a in the unit cell UC2, thereby inhibiting considerable increase of ON resistance.

In the structure of FIG. 34, the unit chain structure CLU1 is formed by coupling the unit cells UC1 and the unit cells UC2 alternately. However, this is not the only example but the unit chain structure CLU1 may be composed of the unit cells UC1 and the unit cells UC2 of different ratios. In this case, it is preferable that the number of the unit cells UC1 be larger than that of the unit cells UC2 in terms of preventing considerable increase of ON resistance.

<Third Embodiment>

Figure 36:
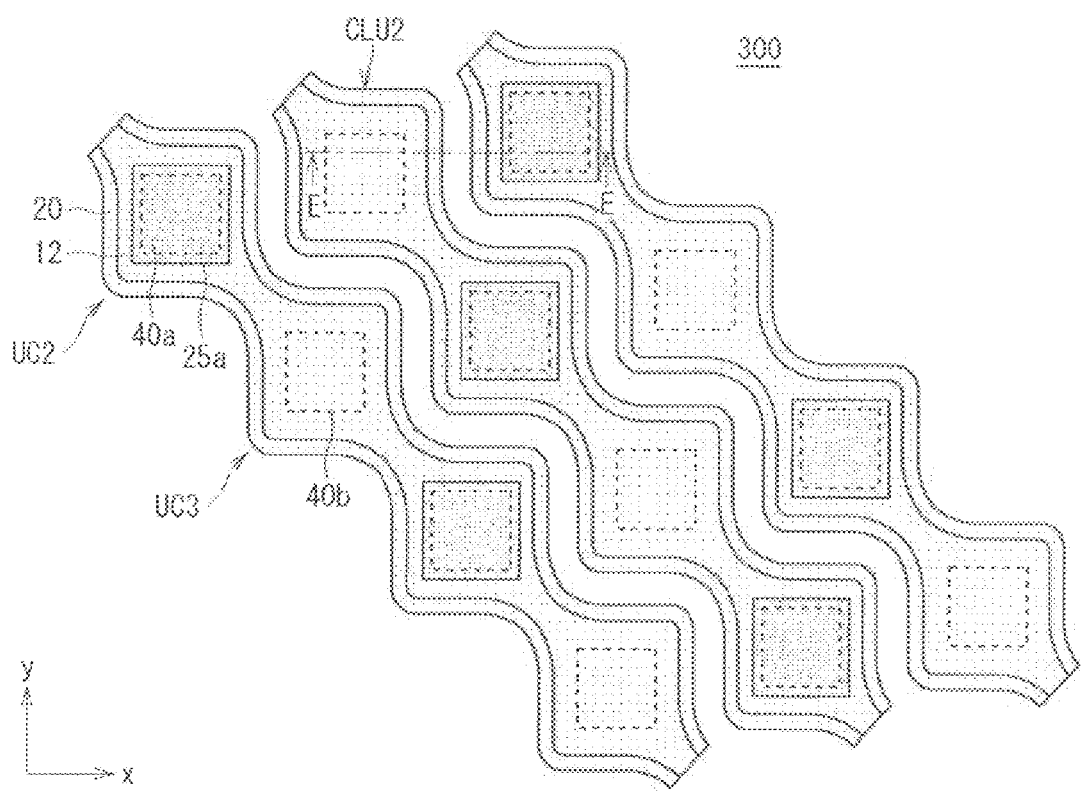
FIG. 36 is a plan view schematically showing an example of arrangement of unit chain structures of a silicon carbide semiconductor device according to a third embodiment of the present invention.
Figure 37:
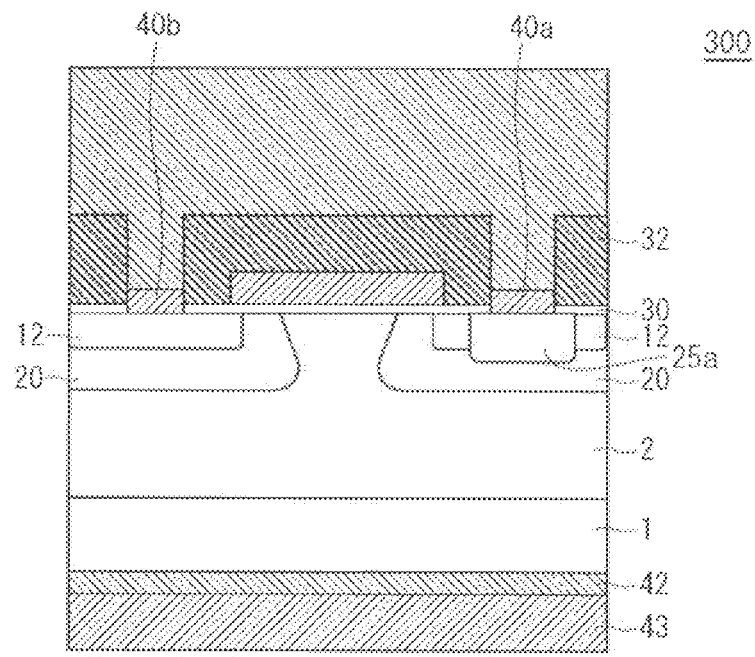
FIG. 37 is a partial sectional view taken at the unit chain structure of the silicon carbide semiconductor device according to the third embodiment of the present invention.

FIG. 36 is a plan view showing arrangement of unit chain structures that form an active region of a silicon carbide MOS transistor 300 of a third embodiment of the present invention. FIG. 36 corresponds to FIG. 7 of the first embodiment. FIG. 37 shows a structure in cross section of the silicon carbide MOS transistor 300 taken along line E-E of FIG. 36. Structures same as those of the silicon carbide MOS transistor 100 of the first embodiment are identified by the same signs and will not be described repeatedly.

In the silicon carbide MOS transistor 300, a unit chain structure CLU2 includes a unit cell UC2 and a unit cell UC3 that are connected alternately. The unit cell UC2 has an ohmic electrode 40a connected to only a well contact region 25a provided in the well region 20. The unit cell UC3 does not have a well contact region in the well region 20 but has an ohmic electrode 40b connected to only the source region 12.

Employing the unit chain structure CLU2 connects the ohmic electrode 40a and the well contact region 25a in a wider area in the unit cell UC2. Thus, the potential of the well region 20 is fixed more reliably. This can prevent occurrence of a high electric field due to potential fluctuations of the well region 20 during switching operation caused by contact failure or delay of switching operation, and damage on the semiconductor device due to the high electric field.

In the unit cell UC3, the ohmic electrode 40b and the source region 12 are connected in a wider area to achieve lower contact resistance. Further, considerable increase of ON resistance can be inhibited as long as the sheet resistance of the source region 12 is sufficiently lower.

More preferably, forming a low-resistance tunnel junction between the source region 12 and the well contact region 25a provides linear current-voltage characteristics between these regions. Further, ON current to flow during ON operation is caused to pass through the ohmic electrode 40a in the unit cell UC2, thereby inhibiting considerable increase of ON resistance.

In the structure of FIG. 36, the unit chain structure CLU2 is formed by coupling the unit cells UC2 and the unit cells UC3 alternately. However, this is not the only example but the unit chain structure CLU2 may be composed of the unit cells UC2 and the unit cells UC3 of different ratios. In this case, it is preferable that the number of the unit cells UC3 be larger than that of the unit cells UC2 in terms of preventing considerable increase of ON resistance.

<Fourth Embodiment>

Figure 38:
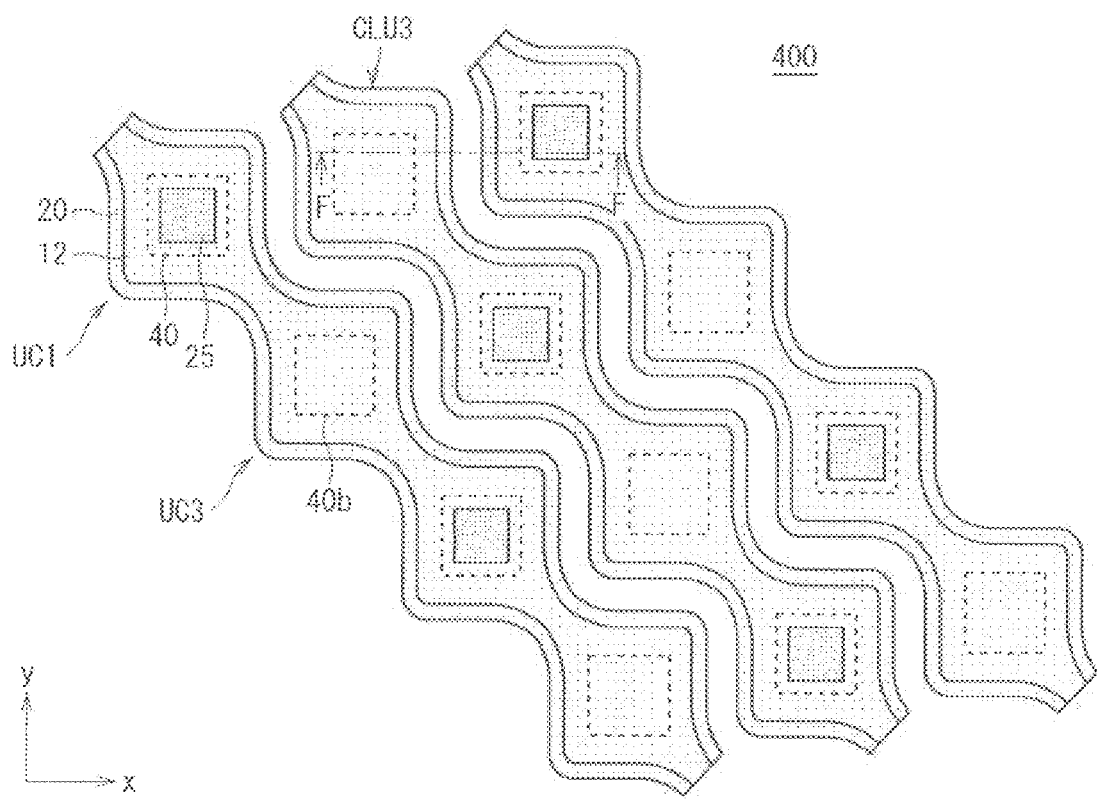
FIG. 38 is a plan view schematically showing an example of arrangement of unit chain structures of a silicon carbide semiconductor device according to a fourth embodiment of the present invention.
Figure 39:
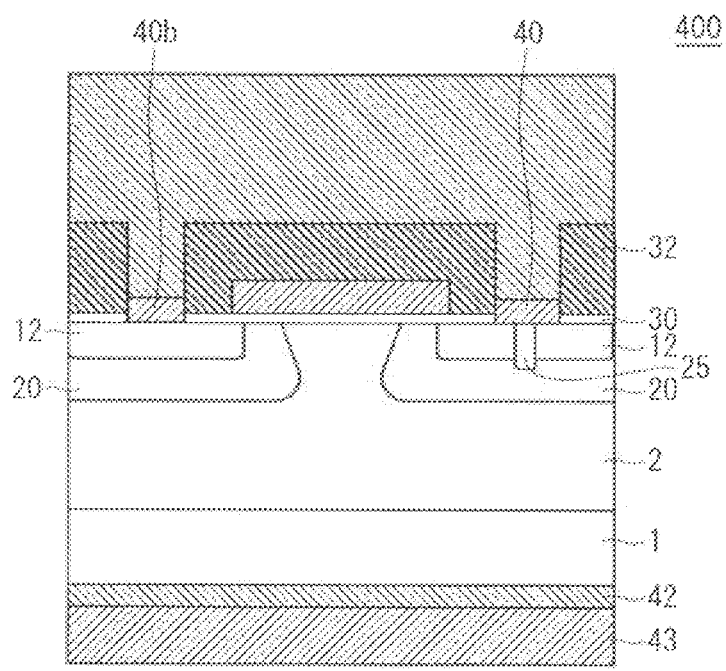
FIG. 39 is a partial sectional view taken at the unit chain structure of the silicon carbide semiconductor device according to the fourth embodiment of the present invention.

FIG. 38 is a plan view showing arrangement of unit chain structures that form an active region of a silicon carbide MOS transistor 400 of a fourth embodiment of the present invention. FIG. 38 corresponds to FIG. 7 of the first embodiment. FIG. 39 shows a structure in cross section of the silicon carbide MOS transistor 400 taken along line F-F of FIG. 38. Structures same as those of the silicon carbide MOS transistor 100 of the first embodiment are identified by the same signs and will not be described repeatedly.

In the silicon carbide MOS transistor 400, a unit chain structure CLU3 includes a unit cell UC1 (corresponding to the unit cell UC of the first embodiment) and a unit cell UC3 that are connected alternately. In the unit cell UC1, the ohmic electrode 40 is connected to both the source region 12 and the well contact region 25 provided in the well region 20. The unit cell UC3 does not have a well contact region in the well region 20 but has an ohmic electrode 40*b* connected to only the source region 12.

Employing the unit chain structure CLU3 connects the ohmic electrode 40*b* and the source region 12 in a wider area in the unit cell UC3 to achieve lower contact resistance. Further, considerable increase of ON resistance can be inhibited as long as the sheet resistance of the source region 12 is sufficiently lower.

In the structure of FIG. 38, the unit chain structure CLU3 is formed by coupling the unit cells UC1 and the unit cells UC3 alternately. However, this is not the only example but the unit chain structure CLU3 may be composed of the unit cells UC1 and the unit cells UC3 of different ratios. In this case, it is preferable that the number of the unit cells UC1 be larger than that of the unit cells UC3 in terms of smoothening a potential distribution in the well region 20.

The aforementioned effects achieved in the first to fourth embodiments are not affected by a method of manufacturing the structures of the first to fourth embodiments. Accordingly, employing a method different from the method described as an example in the first embodiment to manufacture the semiconductor devices of the first to fourth embodiments does not have any influence on the aforementioned effects.

The embodiments of the present invention have been disclosed and described in detail. The foregoing description is an example of an applicable aspect of the present invention and is not intended to limit the present invention. Specifically, various alterations or modifications of the described aspect can be devised without departing from the scope of this invention.

In the present invention, the semiconductor device is described as a vertical MOSFET. Meanwhile, in the structure in cross section shown in FIG. 2, for example, a collector layer of the second conductivity type may be provided between the semiconductor substrate 1 and the ohmic electrode 42 on the rear surface of the semiconductor substrate 1 to form an IGBT (insulated gate bipolar transistor). This also achieves the aforementioned effects of the present invention.

Accordingly, the present invention is applied effectively to a semiconductor device with a MOS structure such as an MOSFET or an IGBT functioning as a switching device.

The present invention defines a semiconductor device itself having the MOS structure described in the first to fourth embodiments as a "semiconductor device" in a narrow sense. The present invention additionally defines a power module itself such as an inverter module as a "semiconductor device" in a broad sense that includes the former semiconductor device, a free-wheeling diode connected in antiparallel to this semiconductor device, a control circuit that generates and applies a gate voltage of this semiconductor device and the like mounted on a lead frame and sealed together.

The invention claimed is:

1. A semiconductor device, comprising:
a semiconductor substrate of a first conductivity type;
a semiconductor layer of the first conductivity type provided on a first main surface of said semiconductor substrate;
a well region of a second conductivity type selectively provided in a main surface of said semiconductor layer; and
a source region of the first conductivity type selectively provided in a surface of said well region, wherein
said semiconductor layer, said well region, and said source region form a unit cell,
said unit cell is defined into a certain shape in plan view at said main surface of said semiconductor layer, and a plurality of said unit cells is coupled in a chain manner to form a unit chain structure with a constriction,
said certain shape of said unit cell is defined by an outer edge of a virtual region of said semiconductor layer defined so as to include said source region and said well region inside and by respective outer edges of said source region and said well region at a joint with a different unit cell,
an active region is composed of a plurality of said unit chain structures, each unit chain structure being arranged in an offset pattern shifted in both horizontal and vertical directions from an adjacent unit chain structure, so as to avoid generation of a gap between said unit cells of adjacent ones of said unit chain structures, and
a distance between said well regions defined by adjacent ones of said unit chain structures is uniform in said active region,
wherein
said certain shape of said unit cell is a hexagonal shape with a pair of opposite corners both having an internal angle of 90 degrees, two opposite sides except four sides forming said pair of opposite corners form said joint, and said unit cells are coupled at said join to connect said source region and said well region in said unit chain structure,
in said unit cell,
said well region extends along the outer edge of said source region and the respective outer edges of said source region and said well region extend linearly along the four sides forming said pair of opposite corners,
in each of areas facing said pair of opposite corners, said source region and said well region form arcuate projections of a central angle of 90 degrees, the projections having the same center of curvature as a first center of curvature while having a first radius of curvature and a second radius of curvature different from each other, and
a distance between the respective outer edges of said well region and said source region is set to be a distance corresponding to a difference between said first and second radii of curvature in every area of said unit cell.

2. The semiconductor device according to claim 1, wherein said unit chain structure has an arcuate recess of a central angle of 90 degrees at said joint of said unit cell, and
in said unit chain structure, said source region and said well region form arcs of a central angle of 90 degrees at said recess, and these arcs have the same center of curvature as a second center of curvature while having a third radius of curvature and fourth radius of curvature different from each other.

3. The semiconductor device according to claim 2, wherein at corners of adjacent ones of said unit chain structures, said first center of curvature at an arcuate projection of a central angle of 90 degrees belonging to one of the adjacent unit chain structures agrees with said second center of curvature at an arcuate recess of a central angle of 90 degrees belonging to the other of said adjacent unit chain structures.

4. The semiconductor device according to claim 1, wherein in said unit chain structure, all the linear outer edges of said well regions in said unit cells extend in a direction not vertical to off direction of said semiconductor substrate and said semiconductor layer.

5. The semiconductor device according to claim 1, comprising a terminal well region of the second conductivity type that defines an edge portion of said active region,
- wherein said unit chain structure has a first configuration in which, at its terminal portion, said well region in said unit chain structure is connected to said terminal well region, said unit chain structure also has a second configuration in which, at its terminal portion, said well region in said unit chain structure is not connected said terminal well region, and these unit chain structures are arranged alternately.

6. The semiconductor device according to claim 1, comprising a terminal source region of the first conductivity type that defines an edge portion of said active region, wherein
- said unit chain structure has a first configuration in which, at its terminal portion, said source region in said unit chain structure is connected to said terminal source region, said unit chain structure also has a second configuration in which, at its terminal portion, said source region in said unit chain structure is not connected said terminal source region,
- in the structure where said source region in said unit chain structure is not connected to said terminal source region, said well region is interposed between said semiconductor layer at the terminal portion and the corresponding terminal source region so as to connect said well regions in adjacent ones of said unit chain structures.

7. The semiconductor device according to claim 1, comprising a terminal well region of the second conductivity type that defines an edge portion of said active region,
- wherein said unit chain structure has a configuration in which, at its at least one terminal portion, said well region in said unit chain structure is connected to said terminal well region.

8. The semiconductor device according to claim 1, comprising a terminal well region of the second conductivity type that defines an edge portion of said active region, wherein
- said unit chain structure has a configuration in which, at its opposite terminal portions, said well region in said unit chain structure is not connected to said terminal well region, and
- a distance between said well regions in said unit chain structures is uniform and a distance between said well region in said unit chain structure and said terminal well region is uniform.

9. The semiconductor device according to claim 1, wherein
- said unit chain structure is composed of a first unit cell and a second unit cell connected to each other,
- said first unit cell has a first ohmic electrode connected to said source region and a well contact region of the second conductivity type provided said well region, and
- said second unit cell has a second ohmic electrode connected to said well contact region while not being connected to said source region.

10. The semiconductor device according to claim 1, wherein
- said unit chain structure is composed of a second unit cell and a third unit cell connected to each other,
- said second unit cell has a second ohmic electrode connected to a well contact region of the second conductivity type provided in said well region while not being connected to said source region, and
- said third unit cell has a third ohmic electrode connected to only said source region.

11. The semiconductor device according to claim 9, wherein in said second unit cell, said well contact region and said source region form a tunnel junction.

12. The semiconductor device according to claim 1, wherein
- said unit chain structure is composed of a first unit cell and a third unit cell connected to each other,
- said first unit cell has a first ohmic electrode connected to the source region and a well contact region of said second conductivity type provided in said well region, and
- said third unit cell has a third ohmic electrode connected to only said source region.

13. The semiconductor device according to claim 1, wherein said semiconductor layer is made of silicon carbide.

14. The semiconductor device according to claim 10, wherein in said second unit cell, said well contact region and said source region form a tunnel junction.

* * * * *